United States Patent
Liu et al.

(10) Patent No.: US 12,557,511 B2
(45) Date of Patent: Feb. 17, 2026

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Ke Liu, Beijing (CN); Ling Shi, Beijing (CN); Zhu Wang, Beijing (CN); Dan Guo, Beijing (CN); Fei Fang, Beijing (CN); Xiaoqi Ding, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 717 days.

(21) Appl. No.: 17/915,113

(22) PCT Filed: Nov. 24, 2021

(86) PCT No.: PCT/CN2021/132903
§ 371 (c)(1),
(2) Date: Sep. 28, 2022

(87) PCT Pub. No.: WO2023/092351
PCT Pub. Date: Jun. 1, 2023

(65) Prior Publication Data
US 2024/0215366 A1    Jun. 27, 2024

(51) Int. Cl.
*G09G 3/32* (2016.01)
*H10K 59/131* (2023.01)
*H10K 59/35* (2023.01)

(52) U.S. Cl.
CPC ......... *H10K 59/353* (2023.02); *H10K 59/131* (2023.02)

(58) Field of Classification Search
CPC .... H10K 59/353; H10K 59/123; H10K 59/65; H10K 59/80518; H10K 2102/351;
(Continued)

(56) References Cited

U.S. PATENT DOCUMENTS

| 2019/0114459 A1 | 4/2019 | Ma et al. |
| 2021/0151517 A1 | 5/2021 | Zhu |

(Continued)

FOREIGN PATENT DOCUMENTS

| CN | 108922469 A | 11/2018 |
| CN | 112117320 A | 12/2020 |

(Continued)

OTHER PUBLICATIONS

Partial supplementary European Search Report for 21965089.2 Mailed Jul. 31, 2024.

*Primary Examiner* — Pegeman Karimi
(74) *Attorney, Agent, or Firm* — Ling Wu; Stephen Yang; Ling and Yang Intellectual Property

(57) ABSTRACT

A display substrate includes a base substrate, a plurality of first-region light emitting elements and a plurality of first-region pixel circuit. The base substrate includes a display region and a peripheral region at least partially surrounding the display region, wherein the display region includes a transparent display region. A plurality of first-region light emitting elements and a plurality of first-region pixel circuits are located in the transparent display region. At least one first-region pixel circuit of the plurality of first-region pixel circuits is electrically connected with at least two first-region light emitting elements emitting light in a same color. An orthographic projection of at least one first-region pixel circuit on the base substrate is overlapped with an orthographic projection of at least one first-region light emitting element on the base substrate.

19 Claims, 27 Drawing Sheets

(58) Field of Classification Search
CPC ......... G09G 3/3233; G09G 2300/0819; G09G 2300/0842; G09G 2320/0233; G09G 2320/0257; G09G 2320/045
See application file for complete search history.

(56) References Cited

U.S. PATENT DOCUMENTS

| | | | |
|---|---|---|---|
| 2021/0217821 A1* | 7/2021 | Han | G09G 3/3208 |
| 2022/0215804 A1* | 7/2022 | Lee | H10K 59/352 |
| 2024/0379065 A1* | 11/2024 | Lee | H10K 59/131 |

FOREIGN PATENT DOCUMENTS

| | | |
|---|---|---|
| CN | 112563303 A | 3/2021 |
| CN | 113437126 A | 9/2021 |
| EP | 3872862 A1 | 9/2021 |

* cited by examiner

DISPLAY SUBSTRATE AND DISPLAY DEVICE

CROSS-REFERENCE TO RELATED APPLICATION

This application is a national stage application of PCT Application No. PCT/CN2021/132903, which is filed on Nov. 24, 2021 and entitled "Display Substrate and Display Device", the content of which is incorporated herein by reference in its entirety.

TECHNICAL FIELD

The present disclosure relates to, but is not limited to, the field of display technology, in particular to a display substrate and a display device.

BACKGROUND

An Organic Light Emitting Diode (OLED) and a Quantum-dot Light Emitting Diode (QLED) are active light emitting display devices and have advantages of self-illumination, a wide angle of view, a high contrast ratio, low power consumption, an extremely high reaction speed, lightness and thinness, bendability, and a low cost, etc. An under display camera technology is a brand-new technology proposed to increase a screen-to-body ratio of a display device.

SUMMARY

The following is a summary of subject matters described herein in detail. The summary is not intended to limit the protection scope of claims.

Embodiments of the present disclosure provide a display substrate and a display device.

In one aspect, a display substrate is provided in at least one embodiment of the present disclosure, which includes a base substrate, a plurality of first-region light emitting elements and a plurality of first-region pixel circuits. The base substrate includes a display region and a peripheral region at least partially surrounding the display region, wherein the display region includes a transparent display region. A plurality of first-region light emitting elements and a plurality of first-region pixel circuits are located in the transparent display region. At least one first-region pixel circuit of the plurality of first-region pixel circuits is electrically connected with at least two first-region light emitting elements emitting light in a same color. an orthographic projection of at least one first-region pixel circuit on the base substrate is overlapped with an orthographic projection of at least one first-region light emitting element on the base substrate.

In some exemplary implementations, a plurality of first-region light emitting elements include a plurality of first light emitting elements emitting light in a first color, a plurality of second light emitting elements emitting light in a second color, and a plurality of third light emitting elements emitting light in a third color. An anode area of at least one first light emitting element of the plurality of first light emitting elements is larger than an anode area of at least one third light emitting element of the plurality of third light emitting elements, and an anode area of at least one second light emitting element of the plurality of second light emitting elements is larger than an anode area of the at least one third light emitting element. An orthographic projection of at least one first-region pixel circuit on the base substrate is overlapped with an orthographic projection of at least one first light emitting element or at least one second light emitting element on the base substrate.

In some exemplary implementations, the first color light is red light, the second color light is blue light, and the third color light is green light.

In some exemplary implementations, the plurality of first-region light emitting elements are arranged according to a Pentile structure.

The plurality of first-region pixel circuits include at least one first pixel circuit, at least one second pixel circuit, and at least one third pixel circuit; wherein the first pixel circuit is electrically connected with two first light emitting elements, the second pixel circuit is electrically connected with two second light emitting elements, and the third pixel circuit is electrically connected with two third light emitting elements. An orthographic projection of the first pixel circuit on the base substrate is overlapped with an orthographic projection of one electrically connected first light emitting element on the substrate. An orthographic projection of the second pixel circuit on the base substrate is overlapped with an orthographic projection of one electrically connected second light emitting element on the base substrate. An orthographic projection of the third pixel circuit on the base substrate is overlapped with an orthographic projection of a first light emitting element or a second light emitting element adjacent to two electrically connected third light emitting elements on the base substrate.

In some exemplary implementations, in a plane perpendicular to the transparent display region, the display substrate at least includes a pixel circuit layer, a first transparent conductive layer and a second transparent conductive layer that are disposed on the base substrate. The pixel circuit layer includes a plurality of first-region pixel circuits. The first transparent conductive layer at least includes a plurality of first signal lines extending along a first direction. The second transparent conductive layer at least includes a plurality of anode connection lines and a plurality of second signal lines extending along a second direction. At least one anode connection line of the plurality of anode connection lines is electrically connected with at least one first-region pixel circuit and anodes of at least two first-region light emitting elements emitting light in a same color. The at least one first-region pixel circuit is electrically connected with at least one first signal line and at least one second signal line; wherein the first direction intersects with the second direction.

In some exemplary implementations, the transparent display region further includes a first electrical connection layer between the first transparent conductive layer and the second transparent conductive layer. The first transparent conductive layer further includes a first anode connection electrode electrically connected with the first-region pixel circuit. The first electrical connection layer at least includes a second anode connection electrode electrically connected with the first anode connection electrode; wherein the anode connection line is electrically connected with the second anode connection electrode.

In some exemplary implementations, the first transparent conductive layer further includes a plurality of first power lines extending along the second direction, and at least one of the plurality of first power lines includes a plurality of sub-power lines. The first electrical connection layer further includes a plurality of power supply connection lines extending along the second direction. In the second direction, adjacent sub-power lines of the first power line are electrically connected through the power supply connection line.

In some exemplary implementations, the at least one first signal line includes a plurality of sub-signal lines; in the first direction, adjacent sub-signal lines of the first signal line are electrically connected through the first-region pixel circuit.

In some exemplary implementations, the plurality of first signal lines include at least one of the followings: a first scan line, a second scan line, a reset control line, an initial signal line, and a light emitting control line.

In some exemplary implementations, an orthographic projection of the first scan line on the base substrate is located between an orthographic projection of the reset control line on the base substrate and an orthographic projection of the second scan line on the base substrate.

In some exemplary implementations, the orthographic projection of the reset control line on the base substrate is located between an orthographic projection of the initial signal line on the base substrate and the orthographic projection of the first scan line on the base substrate, and the orthographic projection of the second scan line on the base substrate is located between the orthographic projection of the first scan line on the base substrate and an orthographic projection of the light emitting control line on the base substrate.

In some exemplary implementations, the plurality of second signal lines include a plurality of data lines. There is no data lines arranged between first-region pixel circuits in a k-th column and first-region pixel circuits in a (k+1)-th column, and there are a plurality of data lines arranged between the first-region pixel circuits in the (k+1)-th column and first-region pixel circuits in a (k+2)-th column, wherein k is an integer.

In some exemplary implementations, the first-region pixel circuit includes at least one first type transistor, at least one second type transistor and at least one storage capacitor. In a plane perpendicular to the display substrate, the pixel circuit layer of the transparent display region includes a first semiconductor layer, a first conductive layer, a second conductive layer, a second semiconductor layer, a third conductive layer, and a fourth conductive layer which are disposed on the base substrate. The first semiconductor layer at least includes an active layer of the first type transistor of the first-region pixel circuit. The first conductive layer at least includes a control electrode of the first type transistor and a first electrode of the storage capacitor of the first-region pixel circuit. The second conductive layer at least includes a second electrode of the storage capacitor of the first-region pixel circuit. The second semiconductor layer at least includes an active layer of the second type transistor of the first-region pixel circuit. The third conductive layer at least includes a control electrode of the second type transistor of the first-region pixel circuit. The fourth conductive layer at least includes a plurality of connection electrodes.

In some exemplary embodiments, the first type transistor of the first-region pixel circuit at least includes a drive transistor. An orthographic projection of the active layer of the second type transistor of the first-region pixel circuit on the base substrate is overlapped with an orthographic projection of the drive transistor on the base substrate.

In some exemplary implementations, an orthographic projection of the control electrode of the second type transistor of the first-region pixel circuit on the base substrate is located between the orthographic projection of the storage capacitor of the first-region pixel circuit on the base substrate and the orthographic projection of the first scan line, which is electrically connected with the first-region pixel circuit, on the base substrate.

In some exemplary implementations, the first-region pixel circuit includes a plurality of transistors and at least one storage capacitor. In a plane perpendicular to the display substrate, the pixel circuit layer of the transparent display region includes a first semiconductor layer, a first conductive layer, a second conductive layer, and a third conductive layer which are disposed on the base substrate. The first semiconductor layer at least includes active layers of a plurality of transistors of the first-region pixel circuit. The first conductive layer at least includes control electrodes of a plurality of transistors and a first electrode of the storage capacitor of the first-region pixel circuit. The second conductive layer at least includes a second electrode of the storage capacitor of the first-region pixel circuit. The third conductive layer at least includes a plurality of connection electrodes.

In some exemplary implementations, the display region further includes a non-transparent display region located on at least one side of the transparent display region. The non-transparent display region is provided with a plurality of second-region light emitting elements and a plurality of second-region pixel circuits. At least one second-region light emitting element of the plurality of second-region light emitting elements is electrically connected with at least one second-region pixel circuit of the plurality of second-region pixel circuits, and an orthographic projection of the second-region light emitting element on the base substrate is overlapped with an orthographic projection of the electrically connected second-region pixel circuit on the base substrate.

In some exemplary implementations, an area of the light emitting region of the first-region light emitting element is 40% to 60% of an area of the light emitting region of the second-region light emitting element that emits light in the same color.

In another aspect, a display device is provided in an embodiment of the present disclosure, which includes the aforementioned display substrate.

Other aspects may be understood upon reading and understanding the drawings and the detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of one or more components in the drawings do not reflect true scales, and are only intended to schematically describe contents of the present disclosure.

DETAILED DESCRIPTION

Figure 1:
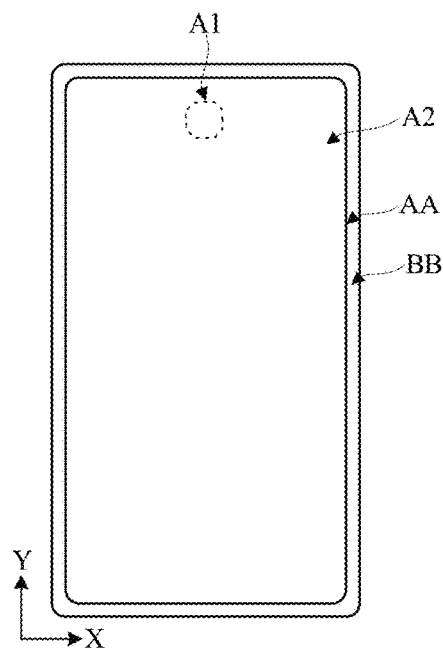
FIG. 1 is a schematic diagram of a display substrate according to at least one embodiment of the present disclosure.

The embodiments of the present disclosure will be described below in combination with the drawings in detail. Implementations may be implemented in a plurality of different forms. Those of ordinary skill in the art may easily understand such a fact that manners and contents may be transformed into other forms without departing from the purpose and scope of the present disclosure. Therefore, the present disclosure should not be explained as being limited to contents described in following implementations only. The embodiments in the present disclosure and features in the embodiments may be combined randomly with each other without conflict.

In the drawings, a size of one or more constituent elements, a thickness of a layer, or a region is sometimes exaggerated for clarity. Therefore, a mode of the present disclosure is not necessarily limited to the size, and a shape and a size of one or more components in the drawings do not reflect a true proportion. In addition, the drawings schematically illustrate ideal examples, and one embodiment of the present disclosure is not limited to the shapes, numerical values, or the like shown in the drawings.

Ordinal numerals such as "first", "second", and "third" in the specification are set to avoid confusion of constituent elements, but not to set a limit in quantity. In the present disclosure, "multiple" represents two or more than two.

In the specification, for convenience, wordings indicating directional or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction where the constituent elements are described. Therefore, appropriate replacements can be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, "electrical connection" includes a case that constituent elements are connected together through an element with a certain electrical effect. The "element having some electrical function" is not particularly limited as long as electrical signals between the connected constituent elements may be transmitted. Examples of the "element having some electrical function" not only include an electrode and a wiring, but further include a switch element such as a transistor, a resistor, an inductor, a capacitor, another element with a plurality of functions, etc.

In the specification, a transistor refers to an element which at least includes three terminals, i.e., a gate, a drain, and a source. The transistor has a channel region between the drain electrode (drain electrode terminal, drain region, or drain) and the source electrode (source electrode terminal, source region, or source), and a current may flow through the drain electrode, the channel region, and the source electrode. In the specification, the channel region refers to a region through which a current mainly flows.

In the specification, a first electrode may be a drain electrode and a second electrode may be a source electrode, or, a first electrode may be a source electrode and a second electrode may be a drain electrode. In a case that transistors with opposite polarities are used, or in a case that a direction of a current changes during work of a circuit, or the like, functions of the "source electrode" and the "drain electrode" may sometimes be exchanged. Therefore, the "source electrode" and the "drain electrode" may be exchanged in the specification. In addition, the gate can also be referred to as a control electrode.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

The "transmittance" in the present disclosure refers to an ability of light to pass through a medium, and is a percentage of the luminous flux passing through a transparent or translucent body to its incident luminous flux.

In the present disclosure, "about" and "approximate" refer to a case that a boundary is defined not so strictly and a process and measurement error within a range is allowed. In the present disclosure, "substantially the same" is a case where values differ by less than 10%.

A display substrate is provided in at least one embodiment of the present disclosure, which includes a base substrate, a plurality of first-region light emitting elements and a plurality of first-region pixel circuit. The base substrate includes a display region and a peripheral region at least partially surrounding the display region, wherein the display region includes a transparent display region. A plurality of first-region light emitting elements and a plurality of first-region pixel circuits are located in the transparent display region. At least one first-region pixel circuit of the plurality of first-region pixel circuits is electrically connected with at least two first-region light emitting elements emitting light in a same color. An orthographic projection of at least one first-region pixel circuit on the base substrate is overlapped with an orthographic projection of at least one first-region light emitting element on the base substrate.

According to the display substrate provided in this embodiment, by reducing a number of first-region pixel circuits in the transparent display region and using one first-region pixel circuit to drive at least two first-region light emitting elements emitting light in a same color, so as to ensure the resolution (PPI) of the display region of the display substrate to be consistent, and improve the transmittance of the transparent display region. The display substrate provided in this embodiment can be applied to a Quarter High Definition (QHD) display device. However, this embodiment is not limited thereto.

In some exemplary implementations, a plurality of first-region light emitting element at least include a plurality of first light emitting elements emitting light in a first color, a plurality of second light emitting elements emitting light in a second color, and a plurality of third light emitting elements emitting light in a third color. an anode area of at least one first light emitting element of the plurality of first light emitting elements is larger than an anode area of at least one third light emitting element of the plurality of third light emitting elements, and an anode area of at least one second light emitting element of the plurality of second light emitting elements is larger than an anode area of the at least one third light emitting element. An orthographic projection of at least one first-region pixel circuit on the base substrate is overlapped with an orthographic projection of at least one first light emitting element or at least one second light emitting element on the base substrate. In some examples, the first color light may be green light, the second color light may be blue light, and the third color light may be red light. In this example, there is no first-region pixel circuit provided on a side of the third light emitting element close to the base substrate. However, this embodiment is not limited thereto. In the present exemplary implementation, by disposing the first-region pixel circuit having a larger anode area below the first-region light emitting element (e.g., the first light emitting element and the second light emitting element), the transmittance of the transparent display region can be improved, which facilitates the diffraction effect to be reduced.

In some exemplary implementations, the plurality of first-region light emitting elements may be arranged according to a Pentile structure. However, this embodiment is not limited thereto.

In some exemplary implementations, a plurality of first-region pixel circuits include at least one first pixel circuit, at least one second pixel circuit and at least one third pixel circuit. The first pixel circuit is electrically connected with the two first light emitting elements, the second pixel circuit is electrically connected with the two second light emitting elements, and the third pixel circuit is electrically connected with the two third light emitting elements. An orthographic projection of the first pixel circuit on the base substrate is overlapped with an orthographic projection of one electrically connected first light emitting element on the substrate. An orthographic projection of the second pixel circuit on the base substrate is overlapped with an orthographic projection of one electrically connected second light emitting element on the base substrate. An orthographic projection of the third pixel circuit on the base substrate is overlapped with an orthographic projection of a first light emitting element or a second light emitting element adjacent to two electrically connected third light emitting elements on the base substrate. In other words, the third pixel circuit is located below the first light emitting element or the second light emitting element, and there is no first-region pixel circuit below the third light emitting element. However, this embodiment is not limited thereto.

In some exemplary implementations, in a plane perpendicular to the transparent display region, the display substrate may at least include a pixel circuit layer, a first transparent conductive layer and a second transparent conductive layer that are disposed on the base substrate. The pixel circuit layer includes a plurality of first-region pixel circuits. The first transparent conductive layer at least includes a plurality of first signal lines extending along a first direction. The second transparent conductive layer at least includes a plurality of anode connection lines and a plurality of second signal lines extending along a second direction. At least one anode connection line of the plurality of anode connection lines is electrically connected with at least one first-region pixel circuit and anodes of at least two first-region light emitting elements emitting light in a same color. At least one first-region pixel circuit is electrically connected with at least one first signal line and at least one second signal line. The first direction and the second direction intersect. For example, the first direction is perpendicular to the second direction. In this exemplary implementation, the first transparent conductive layer is used to arrange the first signal line, and the second transparent conductive layer is used to arrange the second signal line, so that the transmittance of the transparent display region can be improved and is beneficial to reducing the diffraction effect.

In some exemplary implementations, the transparent display region may further include a first electrical connection layer between the first transparent conductive layer and the second transparent conductive layer. The first transparent conductive layer may further include a first anode connection electrode electrically connected with the first-region pixel circuit. The first electrical connection layer at least includes a second anode connection electrode electrically connected with the first anode connection electrode. An anode connection line of the second transparent conductive layer is electrically connected with a second anode connection electrode of the first electrical connection layer. In this example, the electrical connection between the first-region pixel circuit and the first-region light emitting element is achieved by the first transparent conductive layer, the first electrical connection layer and the second transparent conductive layer. However, this embodiment is not limited thereto.

In some exemplary implementations, the first transparent conductive layer may further include a plurality of first power lines extending along the second direction. At least one of the plurality of first power lines includes a plurality of sub-power lines. The first electrical connection layer may further include a plurality of power supply connection lines extending along the second direction. In the second direction, adjacent sub-power lines of the first power line are electrically connected through the power supply connection line. However, this embodiment is not limited thereto. For example, the first power line located in the first transparent conductive layer is electrically connected without a power supply connection line.

In some exemplary implementations, at least one first signal line includes a plurality of sub-signal lines. In the first direction, adjacent sub-signal lines of the first signal line are electrically connected by a first-region pixel circuit. In this example, the first signal lines are arranged in the first transparent conductive layer and electrically connected by the first-region pixel circuit, so that the transmittance of the transparent display region can be improved.

In some exemplary implementations, the plurality of first signal lines may include at least one of the followings: a first scan line, a second scan line, a reset control line, an initial signal line, and a light emitting control line. However, this embodiment is not limited thereto.

In some exemplary implementations, the plurality of second signal lines include a plurality of data lines. There is no data lines arranged between first-region pixel circuits in a k-th column and first-region pixel circuits in a (k+1)-th column, and there are a plurality of data lines arranged between the first-region pixel circuits in the (k+1)-th column and first-region pixel circuits in a (k+2)-th column, wherein k is an integer. However, this embodiment is not limited thereto.

In some exemplary implementations, the first-region pixel circuit includes at least one first type transistor, at least one second type transistor and at least one storage capacitor. For example, the first-region pixel circuit may be of an 8T1C (i.e. eight transistors and one capacitor) structure. In a plane perpendicular to the display substrate, the pixel circuit layer of the transparent display region may include a first semiconductor layer, a first conductive layer, a second conductive layer, a second semiconductor layer, a third conductive layer, and a fourth conductive layer which are disposed on the base substrate. The first semiconductor layer at least includes an active layer of the first type transistor of the first-region pixel circuit. The first conductive layer at least includes a control electrode of the first type transistor and a first electrode of the storage capacitor of the first-region pixel circuit. The second conductive layer at least includes a second electrode of the storage capacitor of the first-region pixel circuit. The second semiconductor layer at least includes an active layer of the second type transistor of the first-region pixel circuit. The third conductive layer at least includes a control electrode of the second type transistor of the first-region pixel circuit. The fourth conductive layer at least includes a plurality of connection electrodes. The display substrate in this example may be an LTPO display substrate.

In some exemplary implementations, the first-region pixel circuit includes a plurality of transistors and at least one storage capacitor. For example, the first-region pixel circuit may be of a 7T1C or 5T1C structure. In a plane perpendicular to the display substrate, the pixel circuit layer of the transparent display region includes a first semiconductor layer, a first conductive layer, a second conductive layer, and a third conductive layer which are disposed on the base substrate. The first semiconductor layer at least includes active layers of a plurality of transistors of the first-region pixel circuit. The first conductive layer at least includes control electrodes of a plurality of transistors and a first electrode of the storage capacitor of the first-region pixel circuit. The second conductive layer at least includes a second electrode of the storage capacitor of the first-region pixel circuit. The third conductive layer at least includes a plurality of connection electrodes. The display substrate in this example may be an LTPS display substrate.

In some exemplary implementations, the display region may further include a non-transparent display region located on at least one side of the transparent display region. The non-transparent display region is provided with a plurality of second-region light emitting elements and a plurality of second-region pixel circuits. At least one second-region light emitting element of the plurality of second-region light emitting elements is electrically connected with at least one second-region pixel circuit of the plurality of second-region pixel circuits, and an orthographic projection of the second-region light emitting element on the base substrate is overlapped with an orthographic projection of the electrically connected second-region pixel circuit on the base substrate.

Solutions of the embodiment will be described below through some examples.

FIG. 1 is a schematic diagram of a display substrate according to at least one embodiment of the present disclosure. In some exemplary implementations, as shown in FIG. 1, the display substrate includes a display region AA and a peripheral region BB located on the periphery of the display region AA. The display region AA of the display substrate may include a first display region A1 and a second display region A2 located on at least one side of the first display region A1. In some examples, the first display region A1 is the aforementioned transparent display region, and the first display region A1 can also be referred to as an Under Display Camera (UDC) region. The second display region A2 is the aforementioned non-transparent display region, and the second display region A2 can also be referred to as a normal display region. For example, an orthographic projection of hardware such as a photosensitive sensor (such as a camera, an infrared sensor) on the display substrate may be located in the first display region A1 of the display substrate. In some examples as shown in FIG. 1, the first display region A1 may be circular and the size of the orthographic projection of the photosensitive sensor on the display substrate may be less than or equal to the size of the first display region A1. However, this embodiment is not limited thereto. In other examples, the first display region may be rectangular, and the size of the orthographic projection of the photosensitive sensor on the display substrate may be less than or equal to the size of an inscribed circle of the first display region.

In some exemplary implementations as shown in FIG. 1, the first display region A1 may be located at a top center position of the display region AA. The second display region A2 may surround the first display region A1. However, this embodiment is not limited thereto. For example, the first display region A1 may be located in other positions such as an upper left corner or an upper right corner of the display region AA.

In some exemplary implementations as shown in FIG. 1, the display region may be of a shape of a rectangle, e.g., a rounded rectangle. The first display region A1 may be circular or elliptical. However, this embodiment is not limited thereto. For example, the first display region may be rectangular, pentagonal, hexagonal or in another shape.

In some exemplary implementations, the display region AA at least includes a plurality of regularly arranged pixel units, a plurality of gate lines (for example, including a scanning line, a reset control line, and a light emitting control line) extending along a first direction X, a plurality of data lines extending along a second direction Y, and a power line. The first direction X and the second direction Y are located in a same plane, and the first direction X intersects with the second direction Y, for example, the first direction X is perpendicular to the second direction Y.

In some exemplary implementations, a pixel unit in the display region AA may include three sub-pixels, wherein the three sub-pixels may be a red sub-pixel, a green sub-pixel, and a blue sub-pixel respectively. However, this embodiment is not limited thereto. In some examples, one pixel unit may include four sub-pixels, which may be a red sub-pixel, a green sub-pixel, a blue sub-pixel, and a white sub-pixel respectively.

In some exemplary implementations, a shape of a sub-pixel may be a rectangle, a rhombus, a pentagon, or a hexagon. The pixel unit includes three sub-pixels that may be arranged side by side horizontally, side by side vertically, or in a form of a triangle, alternatively, the pixel unit includes four sub-pixels that may be arranged side by side horizontally, side by side vertically, or in a shape of a square. However, this embodiment is not limited thereto.

In some exemplary implementations, at least one sub-pixel includes a pixel circuit and a light emitting element. The pixel circuit is configured to drive a connected light emitting element. For example, the pixel circuit is configured to provide a drive current to drive the light emitting element to emit light. The pixel circuit may include a plurality of transistors and at least one capacitor. For example, the pixel circuit may be of a 3T1C (three transistors and one capacitor) structure, an 8T1C (eight transistors and one capacitor) structure, a 7T1C (seven transistors and one capacitor) structure, or a 5T1C (five transistors and one capacitor) structure. In some example, the light emitting element may be an Organic Light Emitting Diode (OLED), and the light emitting element emits red light, green light, blue light, or white light, etc. when driven by a pixel circuit corresponding to the light emitting element. A color of light emitted from the light emitting element may be determined as required. The light emitting element may include an anode, a cathode and an organic light emitting layer disposed between the anode and the cathode. The anode of the light emitting element may be electrically connected with a corresponding pixel circuit. However, this embodiment is not limited thereto.

In some exemplary implementations, the first display region A1 is provided with a plurality of first-region light emitting elements and a plurality of first-region pixel circuits. At least one first-region pixel circuit is electrically connected with at least two first-region light emitting elements emitting light in a same color. That is, at least two sub-pixels in a same color in the first display region A1 share one pixel circuit. The second display region A2 is provided with a plurality of second-region light emitting elements and a plurality of second-region pixel circuits. The plurality of second-region light emitting elements and the plurality of second-region pixel circuits are electrically connected in one-to-one correspondence. In the display substrate according to the exemplary implementation, a first-region pixel circuit is used to drive at least two first-region light emitting elements in the first display region A1, so that the resolution of the display region of the display substrate is consistent and the transmittance of the transparent display region is improved. However, this embodiment is not limited thereto. For example, a first-region pixel circuit is electrically connected with a first-region light emitting element. That is, a plurality of first-region pixel circuits and a plurality of first-region light emitting elements may be electrically connected in one-to-one correspondence.

Figure 2:
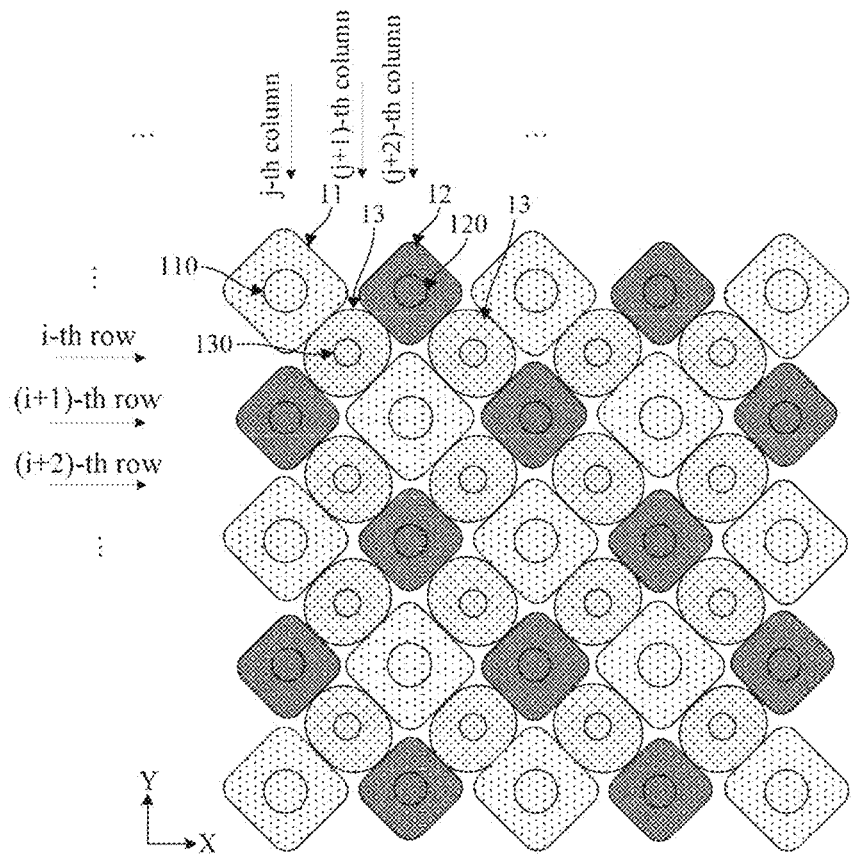
FIG. 2 is a schematic diagram of an arrangement of a first-region light emitting element in a first display region according to at least one embodiment of the present disclosure.

FIG. 2 is a schematic diagram of an arrangement of a first-region light emitting element in a first display region according to at least one embodiment of the present disclosure. In some exemplary implementations as shown in FIG. 2, a plurality of first-region light emitting element in the first display region A1 may include a plurality of first light emitting elements 11 emitting light in a first color, a plurality of second light emitting elements 12 emitting light in a second color, and a plurality of third light emitting elements 13 emitting light in a third color. For example, the light in the first color may be red light, the light in the second color may be green light, and the light in the third color may be blue light. That is, the first light emitting element 11 may be a blue light emitting element the second light emitting element 12 may be a red light emitting element and the third light emitting element 13 may be a green light emitting element. However, this embodiment is not limited thereto.

In some exemplary implementations as shown in FIG. 2, the plurality of first-region light emitting elements in the first display region A1 may be arranged according to a Pentile structure. A plurality of third light emitting elements 13 are arranged at certain intervals in an i-th row, second light emitting elements 12 and first light emitting elements 11 are alternately arranged in an (i+1)-th row adjacent to the i-th row, a plurality of third light emitting elements 13 are arranged at certain intervals in an (i+2)-th row adjacent to the (i+1)-th row, and first light emitting elements 11 and second light emitting elements 12 are alternately arranged in an (i+3)-th row adjacent to the (i+2)-th row. According to the above rule, a plurality of rows of first-region light emitting elements can be repeatedly arranged. The plurality of third light emitting elements 13 arranged in the i-th row and the second light emitting elements 12 and the first light emitting elements 11 arranged in the (i-+1)-th row are alternately arranged. Therefore, a first light emitting elements 11 and the second light emitting elements 12 are alternately arranged in a j-th column, a plurality of third light emitting elements 13 are arranged in a (J+1)-th column adjacent to the J-th column at certain intervals, first light emitting elements 11 and the second light emitting elements 12 are alternately arranged in a (J+2)-th column adjacent to the (J+1)-th column, and a plurality of third light emitting elements 13 are arranged in a (J+3)-th column at certain intervals. According to the above rule, a plurality of columns of first-region light emitting elements can be repeatedly arranged. In this example, dimensions of the first light emitting element 11 and the second light emitting element 12 may both be larger than dimensions of the third light emitting element 13. Both i and j are integers.

In some exemplary implementations as shown in FIG. 2, all of the light emitting region 110 of the first light emitting element 11, the light emitting region 120 of the second light emitting element 12, and the light emitting region 130 of the third light emitting element 13 may be circular or elliptical. The light emitting region 110 of the first light emitting element 11 may be larger than the light emitting region 120 of the second light emitting element 12 and the light emitting region 120 of the second light emitting element 12 may be larger than the light emitting region 130 of the third light emitting element 13. In this example, the light emitting region of the light emitting element may be a portion where the light emitting element is located at a pixel opening of a pixel define layer.

In some exemplary implementations, the light emitting region of the first-region light emitting element in the first display region A1 may be smaller than the light emitting region of the second-region light emitting element in the second display region A2 that emits light in a same color. For example, an area of the light emitting region of the first-region light emitting element may be 40% to 60% (e.g. may be about 50%) of an area of the light emitting region of the second-region light emitting element that emits light in the same color. In this example, by reducing an aperture ratio of the first display region A1, an light transmission region in the first display region A1 can be increased, thereby improving the transmission of the first display region A1.

Figure 3:
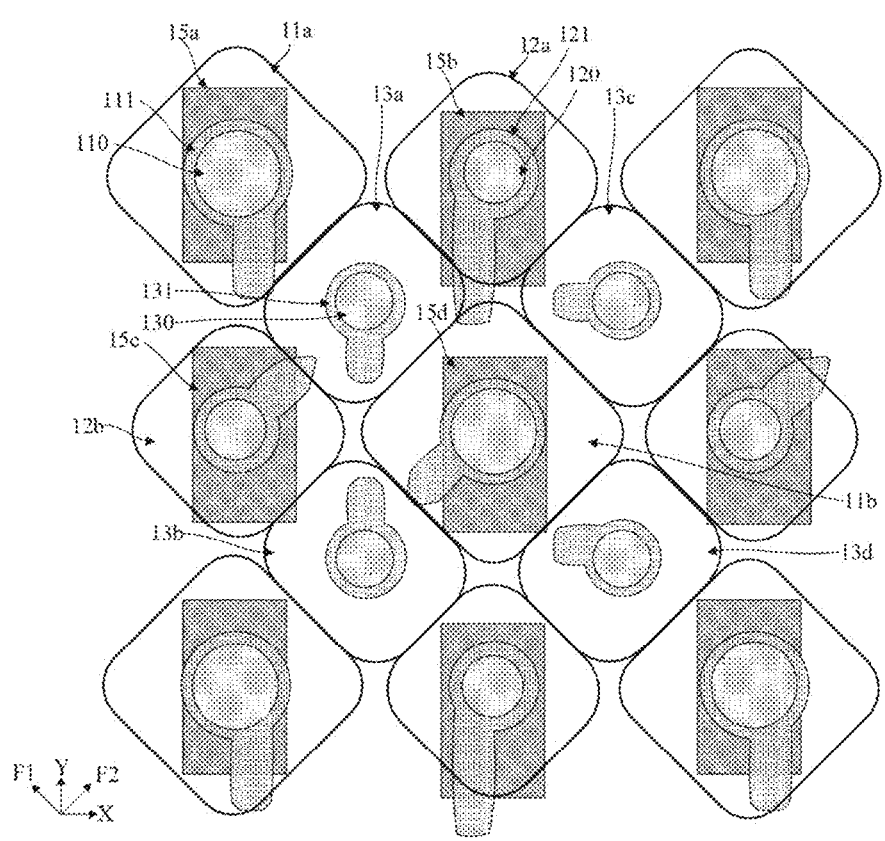
FIG. 3 is a schematic diagram of an arrangement relationship between a first-region pixel circuit and the first-region light emitting element in the first display region according to at least one embodiment of the present disclosure.

FIG. 3 is a schematic diagram of an arrangement relationship between a first-region pixel circuit and the first-region light emitting element in the first display region according to at least one embodiment of the present disclosure. In FIG. 3, a position of the first-region pixel circuit is illustrated with a rectangular frame.

In some exemplary implementations as shown in FIG. 3, an area of an anode 111 of a first light emitting element (e.g. a first light emitting element 11a) is larger than an area of an anode 131 of a third light emitting element (e.g. a third light emitting element 13a), and an area of an anode 121 of a second light emitting element (e.g. a second light emitting element 12a) is larger than the area of the anode 131 of the third light emitting element 13a. The first-region pixel circuit is located below the anode of the first light emitting element or the anode of the second light emitting element having a larger anode area and does not overlap the anode of the third light emitting element having a smaller anode area. In this example, the first-region pixel circuit is disposed below the first-region light emitting element having a larger anode area, and the first-region pixel circuit is not disposed below the first-region light emitting element having a smaller anode area, so that the transmittance of the first display region can be improved.

In some exemplary implementations as shown in FIG. 3, a plurality of first-region pixel circuits in the first display region can at least include a first pixel circuits 15a, a second pixel circuits 15b and third pixel circuits 15c and 15d. The first pixel circuit 15a is electrically connected with the two first light emitting elements 11a and 11b emitting light in a first color and is configured to drive the two first light emitting elements 11a and 11b to emit light. An orthographic projection of the first pixel circuit 15a on the base substrate is overlapped with an orthographic projection of an anode 111 of the first light emitting element 11a on the base substrate and is not overlapped with an orthographic projection of an anode of the first light emitting element 11b on the base substrate. The second pixel circuit 15b is electrically connected with the two second light emitting elements 12a and 12b emitting light in a second color and is configured to drive the two second light emitting elements 12a and 12b to emit light. An orthographic projection of the second pixel circuit 15b on the base substrate is overlapped with an orthographic projection of an anode 121 of the second light emitting element 12a on the base substrate and is not overlapped with an orthographic projection of an anode of the first light emitting element 12b on the base substrate. The third pixel circuit 15c is electrically connected with the two third light emitting elements 13a and 13b emitting light in a third color and is configured to drive the two third light emitting elements 13a and 13b to emit light. An orthographic projection of the third pixel circuit 15c on the base substrate is overlapped with an orthographic projection of an anode of the second light emitting element 12b on the base substrate, and is not overlapped with an orthographic projection of anodes of the two third light emitting elements 13a and 13b on the base substrate. The third pixel circuit 15d is electrically connected with the two third light emitting elements 13c and 13d emitting light in a third color and is configured to drive the two third light emitting elements 13c and 13d to emit light. An orthographic projection of the third pixel circuit 15d on the base substrate is overlapped with an orthographic projection of an anode of the first light emitting element 11b on the base substrate and is not overlapped with an orthographic projection of anodes of the two third light emitting elements 13a and 13b on the base substrate.

In some exemplary implementations as shown in FIG. 3, the two first light emitting elements 11a and 11b with which the first pixel circuit 15a is electrically connected are adjacent in a third direction F1. The third direction F1 intersects with both of the first direction X and the second direction Y. The two first light emitting elements 11a and 11b are spaced apart by one third light emitting element 13a in the third direction F1. Two second light emitting elements 12a and 12b with which the second pixel circuit 15b is electrically connected are adjacent in a fourth direction F2. The fourth direction F2 intersects with all of the first direction X, the second direction Y, and the third direction F1, for example, the fourth direction F2 is perpendicular to the third direction F1. The two second light emitting elements 12a and 12b are spaced apart by one third light emitting element 13a in the fourth direction F2.

In some exemplary implementations as shown in FIG. 3, the two third light emitting elements 13a and 13b with which the third pixel circuit 15c is electrically connected are adjacent in the second direction Y (i.e., the two third light emitting elements 13a and 13b are located in a same column). The orthographic projection of the third pixel circuit 15c on the base substrate is overlapped with the orthographic projection of an anode of the second light emitting element 12b, in a column adjacent to the two third light emitting elements 13a and 13b with which the third pixel circuit 15c is electrically connected, on the base substrate. The two third light emitting elements 13c and 13d with which the third pixel circuit 15d is electrically connected are adjacent in the second direction Y (i.e., the two third light emitting elements 13c and 13d are located in a same column). The orthographic projection of the third pixel circuit 15d on the base substrate is overlapped with an anode of the first light emitting element 11b, in a column adjacent to the two third light emitting elements 13a and 13b with which the third pixel circuit 15d is electrically connected, on the base substrate.

In other examples, two adjacent first light emitting elements located in a same column that emit light in a same color may be electrically connected with one first pixel circuit, and two adjacent second light emitting elements located in a same column that emit light in a same color may be electrically connected with one second pixel circuit. Two adjacent third light emitting elements located in the same column and emitting light of the same color may be electrically connected with a third pixel circuit, and the third pixel circuit may be overlapped with an orthographic projection of an anode of a first light emitting element or a second light emitting element in a column adjacent to the two third light emitting elements on the base substrate. However, this embodiment is not limited thereto.

In this exemplary implementation, in the first display region, two first-region light emitting elements emitting light in a same color are driven by one first-region pixel circuit, and the first-region pixel circuit is disposed below the anodes of the first light emitting element and the second light emitting element having a larger anode area, so that the transmittance can be improved on the basis of ensuring the resolution of the display substrate.

Figure 4:
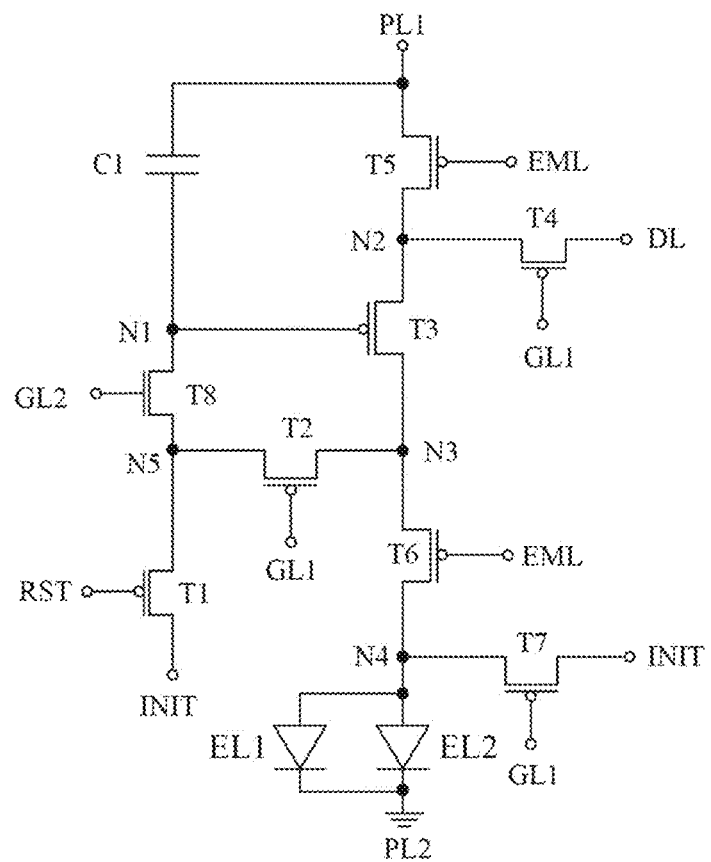
FIG. 4 is an equivalent circuit diagram of a first-region pixel circuit according to at least one embodiment of the present disclosure.

FIG. 4 is an equivalent circuit diagram of a first-region pixel circuit according to at least one embodiment of the present disclosure. In some exemplary implementations as shown in FIG. 4, the first-region pixel circuit according to this exemplary embodiment may be of an 8T1C structure, that is, including a first transistor T1 to an eighth transistor T8 and a first storage capacitor C1. The first-region light emitting elements EL1 and EL2 may emit light in a same color, and may each include an anode, a cathode, and an organic light emitting layer located between the anode and the cathode. In this example, the third transistor T3 is a drive transistor.

In some exemplary implementations, the first transistor T1 to the seventh transistor T7 of the first-region pixel circuit may be first type transistors, such as P-type transistors, and the eighth transistor T8 may be a second type transistor, such as an N-type transistor. However, this embodiment is not limited thereto. For example, the transistors of the first-region pixel circuit may be P-type transistors altogether or may be N-type transistors altogether.

In some exemplary implementations, the first type transistors of the first-region pixel circuit (e.g. the first transistor T1 to the seventh transistor T7) may be low temperature poly-silicon thin film transistors, and the second type transistor of the first pixel circuit (e.g. the eighth transistor T8) may be an oxide thin film transistor. An active layer of a Low Temperature Poly-Silicon thin film transistor is made of Low Temperature Poly-Silicon (LTPS), and an active layer of an oxide thin film transistor is made of an oxide semiconductor (Oxide). A low temperature poly-silicon thin film transistor has advantages such as a high mobility and fast charging, while an oxide thin film transistor has an advantage such as a low leakage current. The Low Temperature Poly-Silicon thin film transistor and the oxide thin film transistor are integrated on one display substrate to form a Low Temperature Polycrystalline Oxide (LTPO) display substrate, and advantages of both the Low Temperature Poly-Silicon thin film transistor and the oxide thin film transistor may be utilized, which may achieve low frequency drive, reduce power consumption, and improve display quality. However, this embodiment is not limited thereto. For example, the transistors of the first-region pixel circuit may be low temperature poly-silicon thin film transistors altogether or oxide thin film transistors altogether.

In some exemplary implementations, as shown in FIG. 4, the first-region pixel circuit is electrically connected with a first scan line GL1, a second scan line GL2, a data line DL, a first power line PL1, a second power line PL2, a light emitting control line EML, an initial signal line INIT, and a reset control line RST. In some examples, the first power line PL1 is configured to provide a constant first voltage signal VDD to a first-region pixel circuit, the second power line PL2 is configured to provide a constant second voltage signal VSS to the first-region pixel circuit, and the first voltage signal VDD is greater than the second voltage signal VSS. The first scan line GL1 is configured to provide a first scan signal SCAN1 to the first-region pixel circuit, the second scan line GL2 is configured to provide a second scan signal SCAN2 to the first-region pixel circuit, the data line DL is configured to provide a data signal DATA to the first-region pixel circuit, the light emitting control line EML is configured to provide a light emitting control signal EM to the first-region pixel circuit, and the reset control line RST is configured to provide a reset control signal RESET to the first-region pixel circuit. In some examples, a reset control line RST of a first-region pixel circuit in an n-th row may be connected with a first scan line GL1 in a first-region pixel circuit in an (n−1)-th row, such that the reset control line RST of the first-region pixel circuit in the n-th row is inputted with a first scan signal SCAN1(n−1), that is, a reset control signal RESET(n) is the same as the scan signal SCAN(n−1). Thus, signal lines of the display substrate may be reduced, and a narrow frame of the display substrate may be achieved.

In some exemplary implementations as shown in FIG. 4, a control electrode of the third transistor T3 is electrically connected with a first node N1, a first electrode of the third transistor T3 is electrically connected with a second node N2, and a second electrode of the third transistor T3 is electrically connected with a third node N3. A control electrode of the fourth transistor T4 is electrically connected with the first scan line GL1, a first electrode of the fourth transistor T4 is electrically connected with the data line DL, and a second electrode of the fourth transistor T4 is electrically connected with the second node N2. A control electrode of the second transistor T2 is electrically connected with the first scan line GL1, the first electrode of the second transistor T2 is electrically connected with the fifth node N5, and the second electrode of the second transistor T2 is electrically connected with the third node N3. A control electrode of the fifth transistor T5 is electrically connected with the light emitting control line EML, a first electrode of the fifth transistor T5 is electrically connected with the first power line PL1, and a second electrode of the fifth transistor T5 is electrically connected with the second node N2. A control electrode of the sixth transistor T6 is electrically connected with the light emitting control line EML, a first electrode of the sixth transistor T6 is electrically connected with the third node N3, and a second electrode of the sixth transistor T6 is electrically connected with a fourth node N4. A control electrode of the first transistor T1 is electrically connected with the reset control line RST, a first electrode of the first transistor T1 is electrically connected with the initial signal line INIT, and a second electrode of the first transistor T1 is electrically connected with a fifth node N5. A control electrode of the seventh transistor T7 is electrically connected with the first scan line GL1, a first electrode of the seventh transistor T7 is electrically connected with the initial signal line INIT, and a second electrode of the seventh transistor T7 is electrically connected with the fourth node N4. A control electrode of the eighth transistor T8 is electrically connected with the second scan line GL2, a first electrode of the second transistor T8 is electrically connected with the fifth node N5, and a second electrode of the eighth transistor T8 is electrically connected with the first node N1. A first electrode of the first storage capacitor C1 is electrically connected with the first node N1, and a second electrode of the first storage capacitor C1 is electrically connected with the first power line PL1.

In this example, the first node N1 is a connection point of the first storage capacitor C1, the eighth transistor T8 and the third transistor T3, the second node N2 is a connection point of the fifth transistor T5, the fourth transistor T4 and the third transistor T3, the third node N3 is a connection point of the third transistor T3, the second transistor T2 and the sixth transistor T6, the fourth node N4 is a connection point of the sixth transistor T6, the seventh transistor T7 and the two first-region light emitting elements EL1 and EL2, and the fifth node N5 is a connection point of the first transistor T1, the second transistor T2 and the eighth transistor T8.

Figure 5:
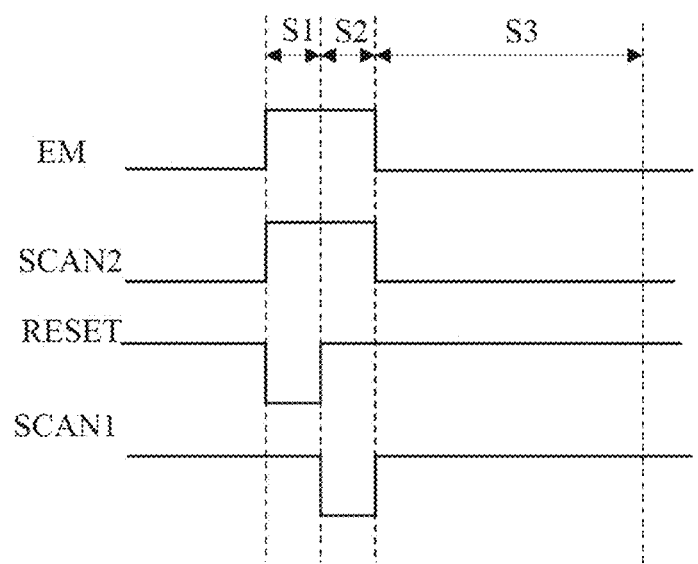
FIG. 5 is a timing diagram illustrating the working of the first-region pixel circuit provided in FIG. 4.

FIG. 5 is a timing diagram illustrating the working of the first-region pixel circuit provided in FIG. 4. A working process of the first-region pixel circuit illustrated in FIG. 4 will be described below with reference to FIG. 5. The first transistor T1 to the seventh transistor T7 of the first-region pixel circuit are P-type transistors, and the eighth transistor T8 is an N-type transistor.

In some exemplary implementations as shown in FIGS. 4 and 5, during a display period of one frame, the working process of the first-region pixel circuit may include a first stage S1, a second stage S2 and a third stage S3.

A first stage S1 is referred to as a reset stage. The reset control signal RESET provided by the reset control line RST is a low-level signal to turn on the first transistor T1, and the second scan signal SCAN2 provided by the second scan line GL2 is a high-level signal to turn on the eighth transistor T8. The initial signal provided by the initial signal line INIT is provided to the fifth node N5 and the first node N1 to initialize the first node N1 and clear an original data voltage in the first storage capacitor C1. The scan signal SCAN1 provided by the first scan line GL1 is a high-level signal, and the light emitting control signal EM provided by the light emitting control line EML is a high-level signal, so that the fourth transistor T4, the second transistor T2, the seventh transistor T7, the fifth transistor T5 and the sixth transistor T6 are turned off. At this stage, the first-region light emitting elements EL1 and EL2 do not emit light.

The second stage S2 is referred to as a data writing stage or a threshold compensation stage. The first scan signal SCAN1 provided by the first scan line GL1 is a low-level signal, all of the second scan signal SCAN2 provided by the second scan line GL2, the reset control signal RESET provided by the reset control line RST and the emitting control signal EM provided by the light emitting control line EML are high-level signals, and the data line DL outputs the data signal DATA. At this stage, the first electrode of the first storage capacitor C1 is of a low level, so that the third transistor T3 is turned on. The first scan signal line SCAN1 is a low-level signal, so that the second transistor T2, the fourth transistor T4, and the seventh transistor T7 are turned on. The second transistor T2, the fourth transistor T4 and the eighth transistor T8 are turned on, so that the data voltage Vdata output by the data line DL is provided to the first node N1 through the turned-on second node N2, the turned-on third transistor T3, the third node N3, the turned-on second transistor T2, the fifth node N5 and the turned-on eighth transistor T8, and a voltage difference between a data voltage Vdata output by the data line DL and a threshold voltage of the third transistor T3 is charged to the first storage capacitor C1, wherein a voltage at the first electrode (i.e., the second node N1) of the first storage capacitor C1 is Vdata−|Vth|, Vdata is the data voltage output by the data line DL, and Vth is the threshold voltage of the third transistor T3. The seventh transistor T7 is turned on, so that the initial signal Vinit provided by the initial signal line INIT is provided to the fourth node N4, and the anodes of the two first-region light emitting elements EL1 and EL2 are initialized (reset) to empty a pre-stored voltages inside the two first-region light emitting elements EL1 and EL2 to complete the initialization, so as to ensure that the first-region light emitting elements EL1 and EL2 do not emit light. The reset control signal RESET provided by the reset control line RST1 is a high-level signal, so that the first reset transistor T1 is turned off. The light emitting control signal EM provided by the light emitting control line EML is a high-level signal, so that the fifth transistor T5 and the sixth transistor T6 are turned off.

The third stage S3 is referred to as an emitting stage. The light emitting control signal EM provided by the light emitting control line EML is a high-level signal, so that the fifth transistor T5 and the sixth transistor T6 are turned on. The second scan signal SCAN2 provided by the second scan line GL2 is a low-level signal, so that the eighth transistor T8 is turned off. The first scan signal SCAN1 provided by the first scan line GL1 and the reset control signal RESET provided by the reset control line RST are high-level signals, so that the second transistor T2, the fourth transistor T4, the seventh transistor T7 and the first transistor T1 are turned off. The first voltage signal VDD outputted by the first power line PL1 provides driving voltages to the anodes of the first-region light emitting elements EL1 and EL2 through the turned-on fifth transistor T5, the third transistor T3 and the sixth transistor T6 to drive the two first-region light emitting elements EL1 and EL2 to emit light.

In a drive process of the first-region pixel circuit, a drive current flowing through the third transistor T3 is determined by a voltage difference between the control electrode and the first electrode of the third transistor T3. Because the voltage of the first node N1 is Vdata-Vth, the driving current of the third transistor T3 is:

$$I = K \times (Vgs - Vth)^2 = $$
$$K \times [(VDD - Vdata + |Vth|) - Vth]^2 = K \times [VDD - Vdata]^2;$$

I is the drive current flowing through the third transistor T3, that is, a drive current for driving the first-region light emitting elements; K is a constant, Vgs is the voltage difference between the control electrode and the first electrode of the drive transistor T3, Vth is the threshold voltage of the third transistor T3, Vdata is the data voltage output by the data line DL, and VDD is the first voltage signal output by the first power line PL1.

It may be seen from the above formula that the current flowing through the first-region light emitting element is independent of the threshold voltage of the third transistor T3. Therefore, the first-region pixel circuit according to this embodiment can compensate the threshold voltage of the third transistor T3 better.

Figure 6:
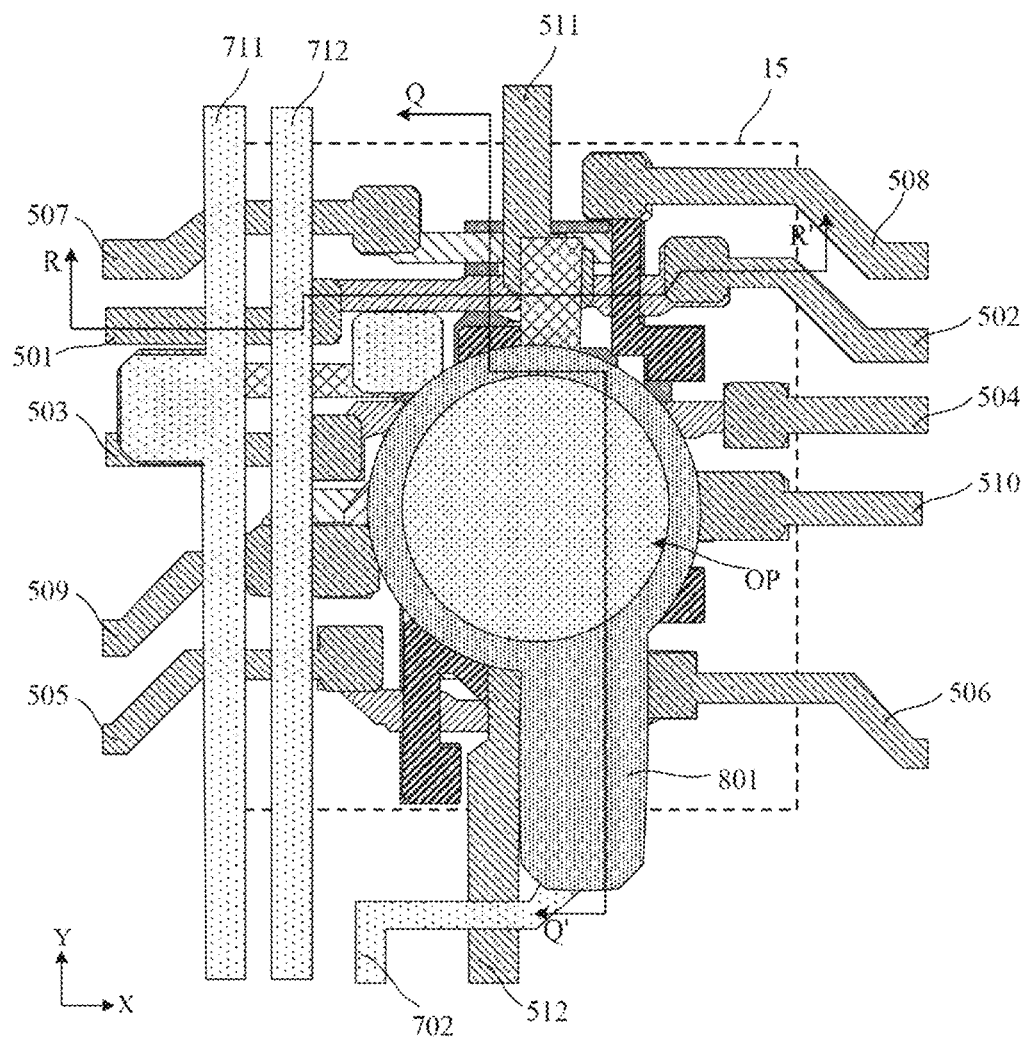
FIG. 6 is a top view of a part of a first display region according to at least one embodiment of the present disclosure.
Figure 7A:
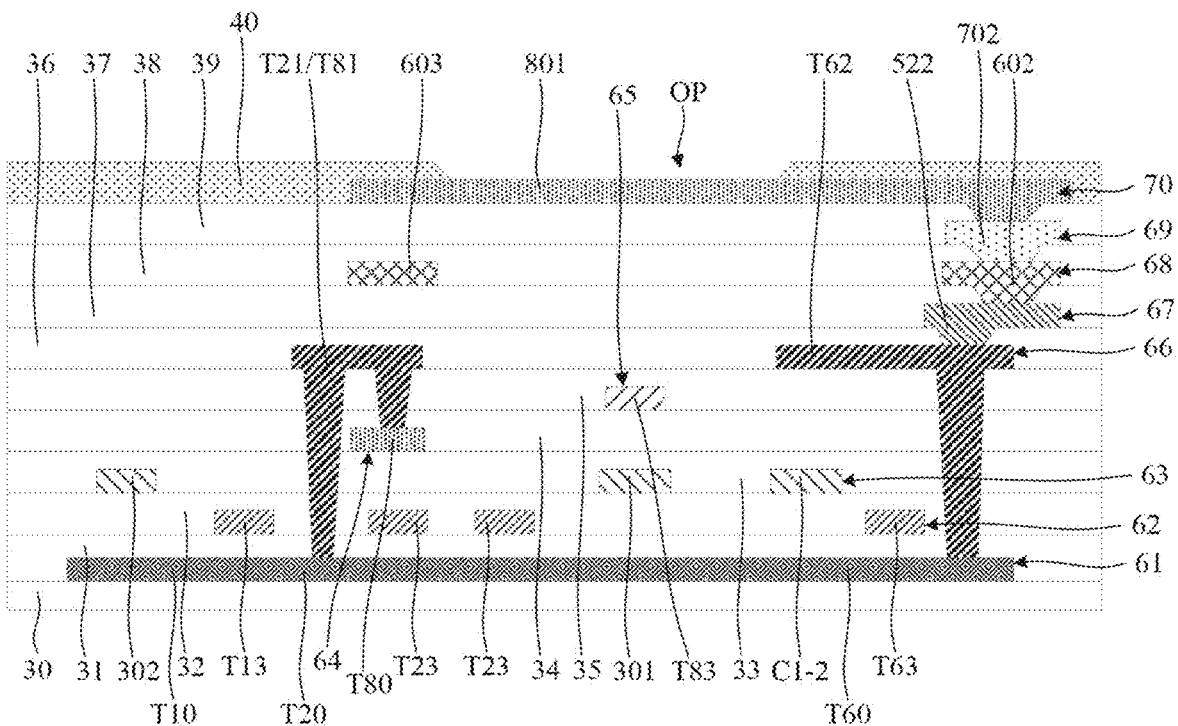
FIG. 7A is a cross-sectional view of a part taken along a Q-Q' direction in FIG. 6.
Figure 7B:
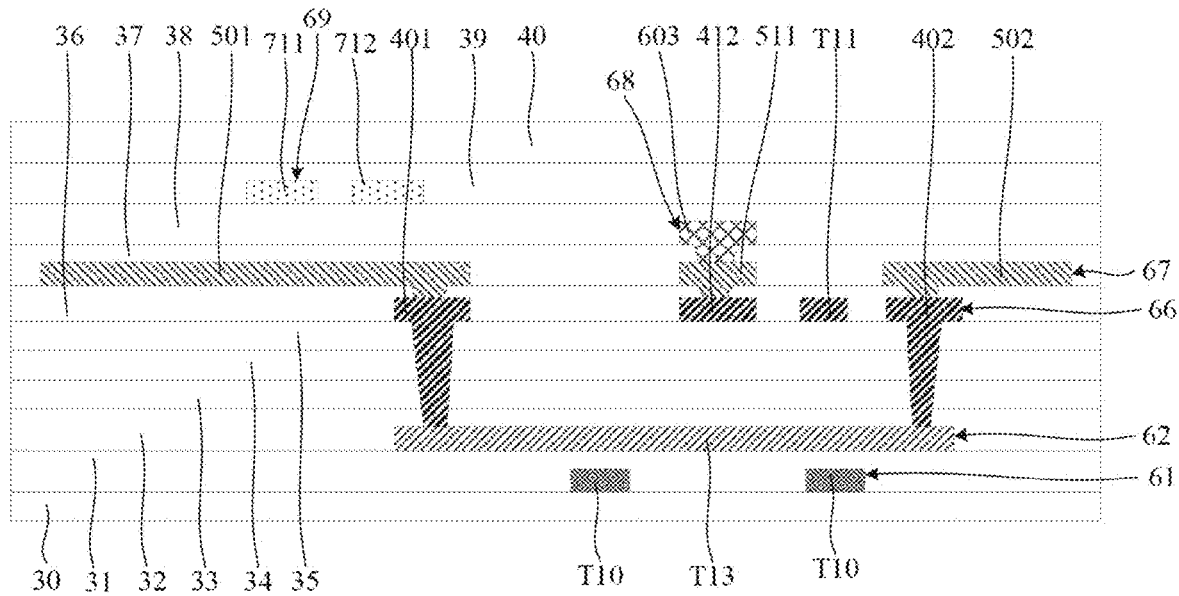
FIG. 7B is a cross-sectional view of a part taken along an R-R' direction in FIG. 6.

FIG. 6 is a top view of a part of a first display region according to at least one embodiment of the present disclosure. FIG. 7A is a cross-sectional view of a part taken along a Q-Q' direction in FIG. 6. FIG. 7B is a cross-sectional view of a part taken along an R-R' direction in FIG. 6. FIG. 6 illustrates a first-region pixel circuit and a first-region light emitting element (e.g. the first pixel circuit 15 and a first light emitting element) in a first display region as an example.

In some exemplary implementations as shown in FIG. 6, an orthographic projection of an anode 801 of the first light emitting element on a base substrate 30 is overlapped with an orthographic projection of the first pixel circuit 15 on the base substrate 30. The first pixel circuit is electrically connected with the anode 801 of the first light emitting element and is configured to drive the first light emitting element to emit light.

In some exemplary implementation as shown in FIGS. 7A and 7B, in a direction perpendicular to a display substrate, the display substrate in the first display region may include the base substrate 30, a pixel circuit layer, a first transparent conductive layer 67, a first electrical connection layer 68 (or a second source-drain metal layer), a second transparent conductive layer 69, an anode layer 70, and a pixel define layer 40 sequentially disposed on the base substrate 30. In some examples, an organic light emitting layer, a cathode layer and an encapsulation layer may be sequentially disposed on a side of the pixel define layer 40 away from the base substrate 30. However, this embodiment is not limited thereto.

In some exemplary implementations as shown in FIGS. 7A and 7B, the pixel circuit layer in the first display region may include a first semiconductor layer 61, a first conductive layer 62 (also known as a first gate metal layer), a second conductive layer 63 (also known as a second gate metal layer), a second semiconductor layer 64, a third conductive layer 65 (also known as a third gate metal layer), and a fourth conductive layer 66 (also known as a first source-drain metal layer) that are sequentially disposed on the base substrate 30. A first insulating layer 31 (also known as a first gate insulating layer) is provided between the first semiconductor layer 61 and the first conductive layer 62. A second insulating layer 32 (also known as a second gate insulating layer) is provided between the first conductive layer 62 and the second conductive layer 63. A third insulating layer 33 (also known as a third gate insulating layer) is provided between the second conductive layer 63 and the second semiconductor layer 64. A fourth insulating layer 34 (also known as a fourth gate insulating layer) is provided between the second semiconductor layer 64 and the third conductive layer 65. A fifth insulating layer 35 (also known as an interlayer insulating layer) is provided between the third conductive layer 65 and the fourth conductive layer 66. A sixth insulating layer 36 (also known as a passivation layer) is provided between the fourth conductive layer 66 and the first transparent conductive layer 67. A seventh insulating layer 37 (also known as a first flat layer) is provided between the first transparent conductive layer 67 and the first electrical connection layer 68. An eighth insulating layer 38 (also known as a second flat layer) is provided between the first electrical connection layer 68 and the second transparent conductive layer 69. A ninth insulating layer 39 (also known as a third flat layer) is provided between the second transparent conductive layer 69 and the anode layer 70. In some examples, the first insulating layer 31 to the sixth insulating layer 36 may be inorganic insulating layers, and the seventh insulating layer 37 to the ninth insulating layer 39 may be organic insulating layers. However, this embodiment is not limited thereto.

Figure 8A:
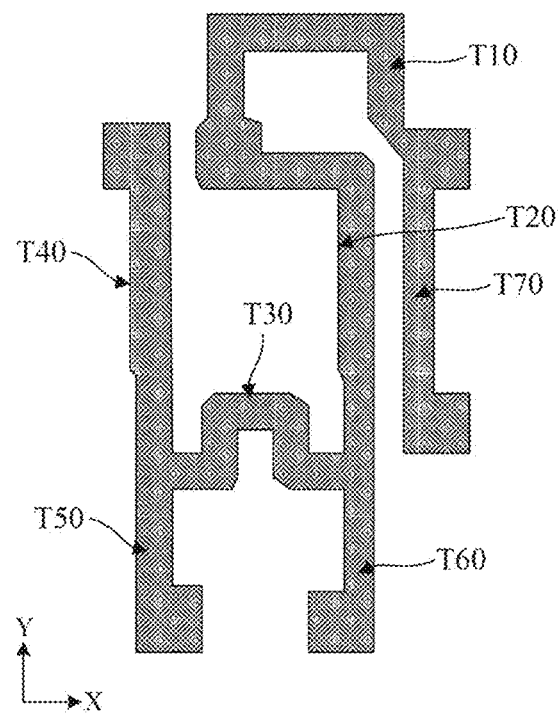
FIG. 8A is a plane schematic diagram of a part of a first display region after forming a first semiconductor layer according to at least one embodiment of the present disclosure.

FIG. 8A is a plane schematic diagram of a part of a first display region after forming a first semiconductor layer according to at least one embodiment of the present disclosure. In some exemplary implementations as shown in FIG. 8A, the first semiconductor layer in the first display region may include active layers of a plurality of first type transistors of a first pixel circuit, for example, an active layer T10 of a first transistor T1, an active layer T20 of a second transistor T2, an active layer T30 of a third transistor T3, an active layer T40 of a fourth transistor T4, an active layer T50 of a fifth transistor T5, an active layer T60 of a sixth transistor T6, and an active layer T70 of a seventh transistor T7. The active layer T10 of the first transistor T1 to the active layer T70 of the seventh transistor T7 of the first pixel circuit may be of an integral structure connected with each other.

In some exemplary implementations, a material of the first semiconductor layer may include, for example, polysilicon. An active layer may include at least one channel region and a plurality of doped regions. The channel region may not be doped with an impurity, and has characteristics of a semiconductor. The plurality of doped regions may be on two sides of the channel region and doped with impurities, and thus have conductivity. The impurities may be changed according to the type of the transistor. In some examples, a doped region of the active layer may be interpreted as a source or a drain of a transistor. A part of the active layer between the transistors may be interpreted as a wiring doped with an impurity, and may be used for electrically connecting the transistors.

Figure 8B:
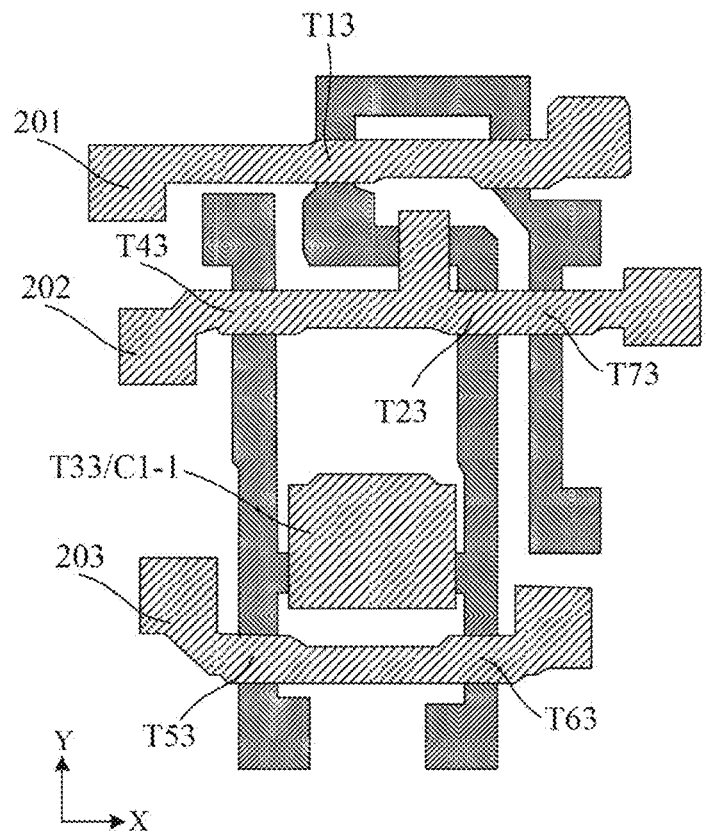
FIG. 8B is a plane schematic diagram of a part of a first display region after forming a first conductive layer according to at least one embodiment of the present disclosure.

FIG. 8B is a plane schematic diagram of a part of a first display region after forming a first conductive layer according to at least one embodiment of the present disclosure. In some exemplary implementations as shown in FIG. 8B, the first conductive layer in the first display region may include control electrodes of a plurality of first type transistors (e.g., a control electrode T13 of the first transistor T1, a control electrode T23 of the second transistor T2, a control electrode T33 of the third transistor T3, a control electrode T43 of the fourth transistor T4, a control electrode T53 of the fifth transistor T5, a control electrode T63 of the sixth transistor T6, and a control electrode T73 of the seventh transistor T7) of a first pixel circuit, a first electrode C1-1 of the first storage capacitor C1 of the first pixel circuit, a reset connection line 201, a first scan connection line 202 and a light emitting connection line 203. All of the reset connection line 201, the first scan connection line 202 and the light emitting connection line 203 extend in the first direction X and are sequentially arranged in the second direction Y.

In some exemplary implementations as shown in FIG. 8B, the first electrode C1-1 of the first storage capacitor C1 and the control electrode T33 of the third transistor T3 may be of an integral structure, for example, may be rectangular. The control electrode T23 of the second transistor T2, the control electrode T43 of the fourth transistor T4, the control electrode T73 of the seventh transistor T7 and the first scan connection line 202 may be of an integral structure. The control electrode T53 of the fifth transistor T5, the control electrode T63 of the sixth transistor T6 and the light emitting connection line 203 may be of an integral structure. The control electrode T13 of the first transistor T1 and the reset connection line 201 may be of an integral structure. However, this embodiment is not limited thereto.

Figure 8C:
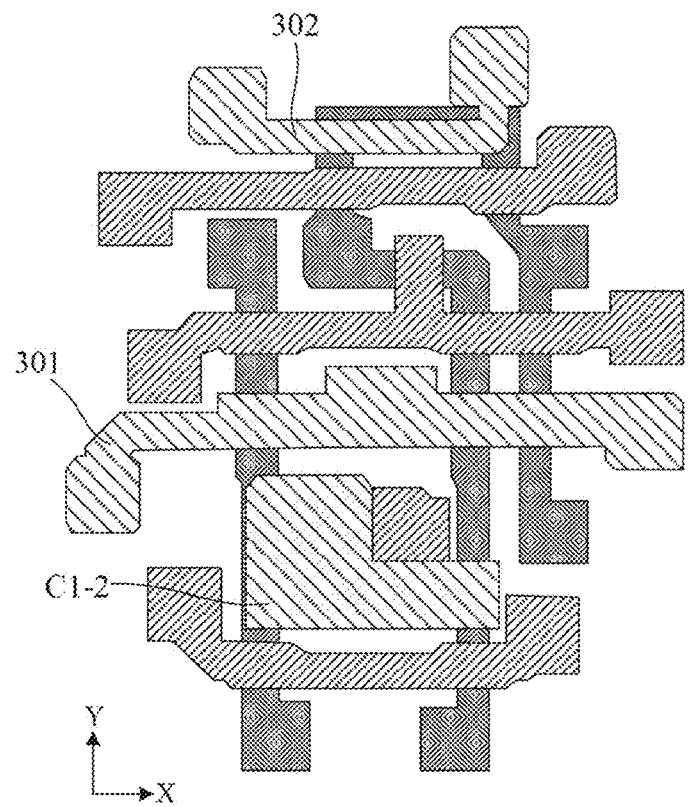
FIG. 8C is a plane schematic diagram of a part of a first display region after forming a second conductive layer according to at least one embodiment of the present disclosure.

FIG. 8C is a plane schematic diagram of a part of a first display region after forming a second conductive layer according to at least one embodiment of the present disclosure. In some exemplary implementations as shown in FIG. 8C, the second conductive layer in the first display region may include an initial connection line 302, a second scan connection line 301, and a second electrode C1-2 of the first storage capacitor C1. Both of the second scan connection electrode 301 and the initial connection line 302 extend along the first direction X. An orthographic projection of the initial connection line 302 on the base substrate is located, in the second direction Y, on a side of the control electrode T13 of the first transistor T1 on the base substrate away from an orthographic projection of the control electrode T23 of the second transistor T2 on the base substrate. An orthographic projection of the second scan connection line 301 on the base substrate is located, in the second direction Y, between an orthographic projection of the control electrode T23 of the second transistor T2 on the base substrate and an orthographic projection of the second electrode C1-2 of the first storage capacitor C1 on the base substrate. The orthographic projection of the second electrode C1-2 of the first storage capacitor C1 on the base substrate is partially overlapped with an orthographic projection portion of the first electrode C1-1 on the base substrate. For example, the orthographic projection of the second electrode C1-2 of the first storage capacitor C1 on the base substrate may be L-shaped. However, this embodiment is not limited thereto.

Figure 8D:
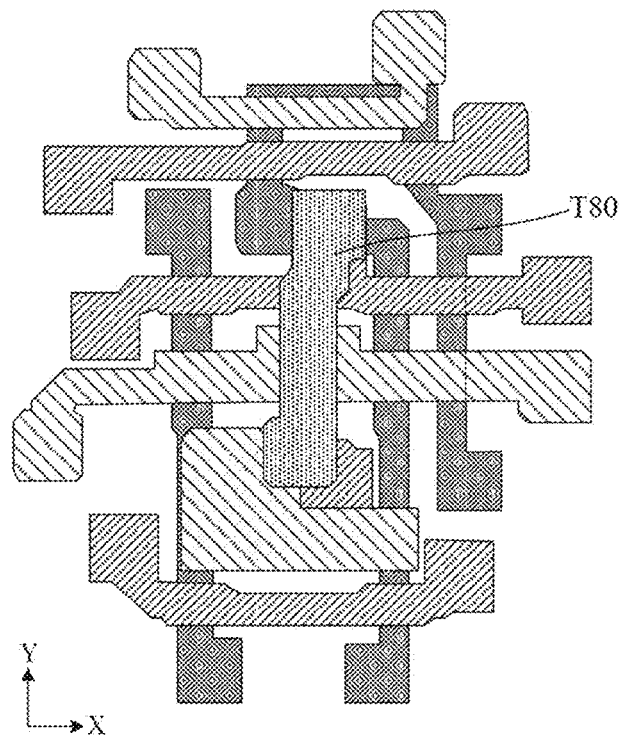
FIG. 8D is a plane schematic diagram of a part of a first display region after forming a second semiconductor layer according to at least one embodiment of the present disclosure.

FIG. 8D is a plane schematic diagram of a part of a first display region after forming a second semiconductor layer according to at least one embodiment of the present disclosure. In some exemplary implementations as shown in FIG. 8D, the second semiconductor layer in the first display region may include an active layer of a second type transistor of the first pixel circuit, for example, an active layer T80 of the eighth transistor T8. The active layer T80 of the eighth transistor T8 extends in the second direction Y. An orthographic projection of the active layer T80 of the eighth transistor T8 on the base substrate is overlapped with the orthographic projection of the second scan connection line 301 on the base substrate. In the present exemplary implementation, a material of the second semiconductor layer may include a metal oxide such as Indium Gallium Zinc Oxide (IGZO).

Figure 8E:
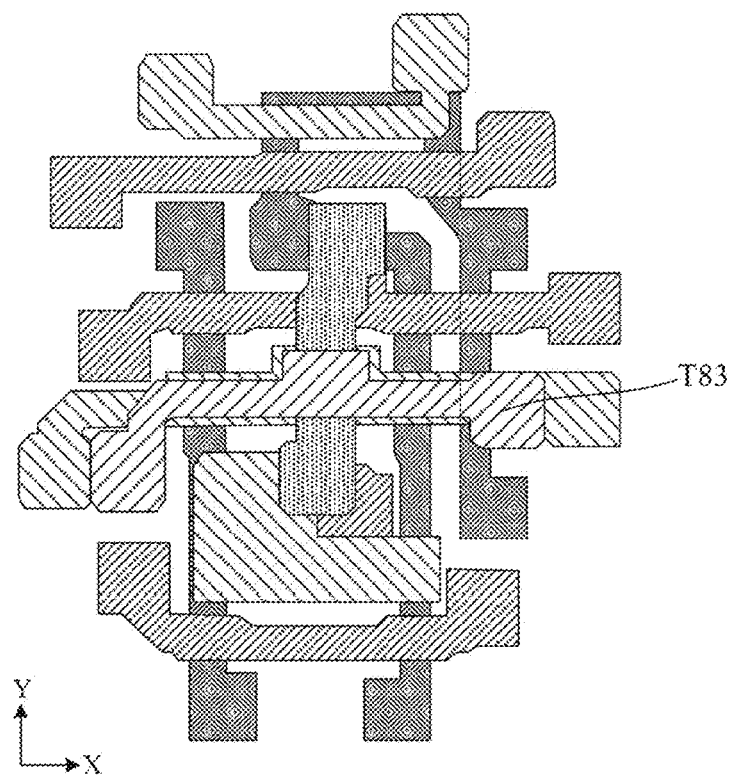
FIG. 8E is a plane schematic diagram of a part of a first display region after forming a third conductive layer according to at least one embodiment of the present disclosure.

FIG. 8E is a plane schematic diagram of a part of a first display region after forming a third conductive layer according to at least one embodiment of the present disclosure. In some exemplary implementations as shown in FIG. 8E, the third conductive layer in the first display region may include a control electrode of a second type transistor of the first pixel circuit, for example, a control electrode T83 of the eighth transistor T8. The control electrode T83 of the eighth transistor T8 extends in the first direction X. An orthographic projection of the control electrode T83 of the eighth transistor T8 on the base substrate is overlapped with the orthographic projection of the active layer T80 of the eighth transistor T8 on the base substrate. The orthographic projection of the second scan connection line 301 on the base substrate, the orthographic projection of the active layer T80 of the eighth transistor T8 on the base substrate, and the orthographic projection of the control electrode T83 of the eighth transistor T8 on the base substrate are overlapped. In this example, the second scan connection line 301 may serve as a bottom gate of the eighth transistor T8, thereby forming an eighth transistor T8 of a double gate structure. However, this embodiment is not limited thereto.

Figure 8F:
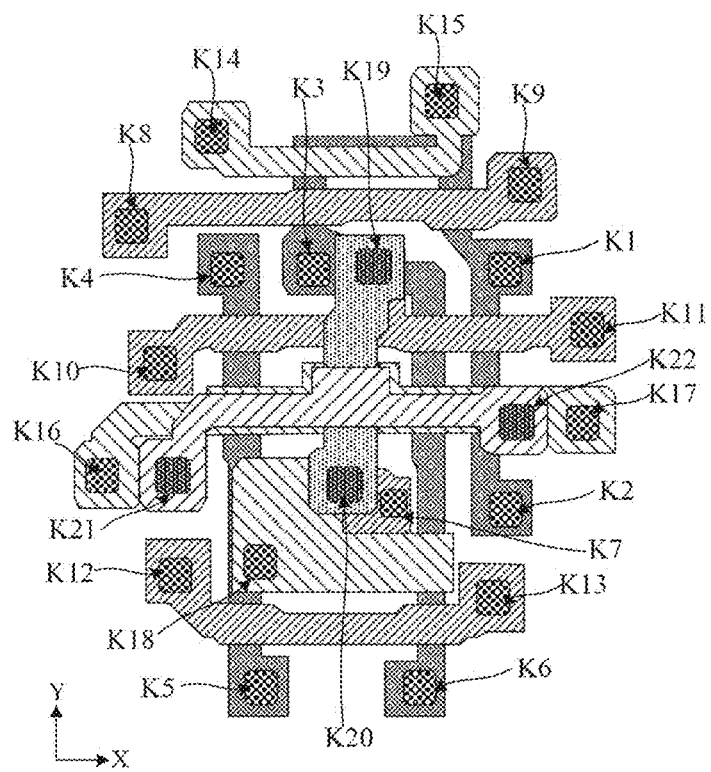
FIG. 8F is a plane schematic diagram of a part of a first display region after forming a fifth insulating layer according to at least one embodiment of the present disclosure.

FIG. 8F is a plane schematic diagram of a part of a first display region after forming a fifth insulating layer according to at least one embodiment of the present disclosure. In some exemplary implementations as shown in FIG. 8F, a plurality of via holes are formed on the fifth insulating layer in the first display region, and the plurality of via holes may at least include a first via hole K1 to a twenty-second via hole K22. The fifth insulating layer 35, the fourth insulating layer 34, the third insulating layer 33, the second insulating layer 32 and the first insulating layers 31 within the first via hole K1 through the sixth via hole K6 are etched off to expose a surface of the first semiconductor layer. The fifth insulating layers 35, the fourth insulating layers 34, the third insulating layers 33, and the second insulating layers 32 within the seventh via hole K7 through the thirteenth via hole K13 are etched off to expose a surface of the first conductive layer. The third insulating layers 35, the fourth insulating layers 34 and the first insulating layers 33 within the fourteenth via hole K14 through the eighteenth K18 are etched off to expose a surface of the second conductive layer. The fifth insulating layers 35 and fourth insulating layers 34 within the nineteenth via hole K19 and the twentieth via hole K20 are etched off to expose a surface of the second semiconductor layer. The fifth insulating layers 35 within the twenty-first via hole K21 and the twenty-two via hole K22 are etched off to expose a surface of the third conductive layer.

Figure 8G:
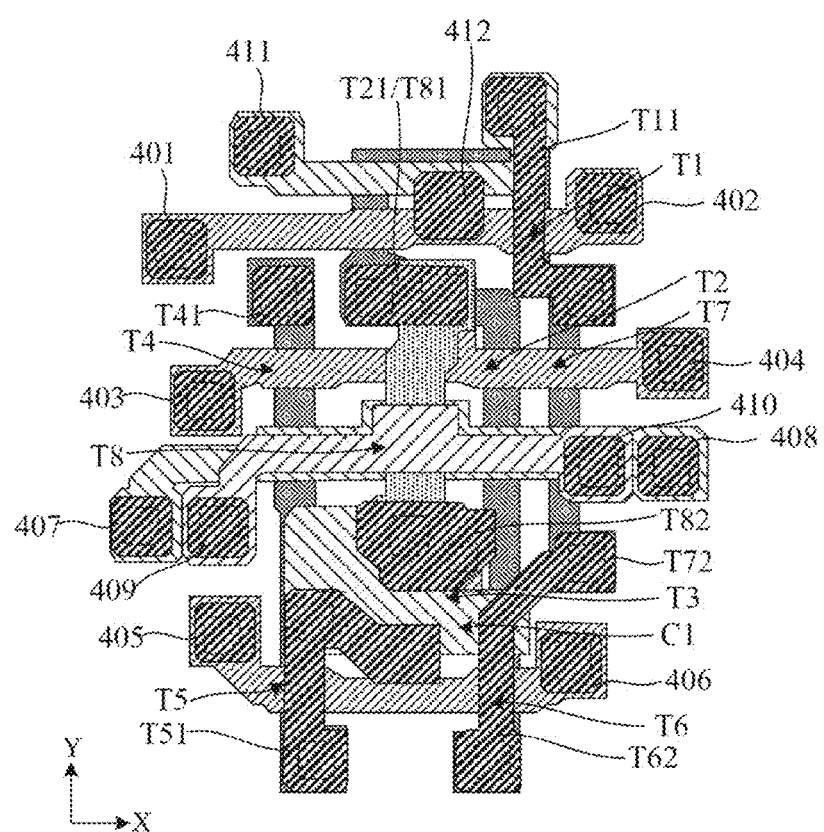
FIG. 8G is a plane schematic diagram of a part of a first display region after forming a fourth conductive layer according to at least one embodiment of the present disclosure.

FIG. 8G is a plane schematic diagram of a part of a first display region after forming a fourth conductive layer according to at least one embodiment of the present disclosure. In some exemplary implementations as shown in FIG. 8G, the fourth conductive layer in the first display region may include first electrodes and second electrodes of a plurality of transistors of the first pixel circuit (e.g., a first electrode T11 of the first transistor T1, a first electrode T21 of the second transistor T2, a first electrode T41 of the fourth transistor T4, a first electrode T51 of the fifth transistor T5, a second electrode T62 of the sixth transistor T6, a second electrode T72 of the seventh transistor T7, a first electrode T81 of the eighth transistor T8, and a second electrode T82 of the eighth transistor T8), a plurality of connection electrodes (e.g., a first connection electrode 401, a second connection electrode 402, a third connection electrode 403, a fourth connection electrode 404, a fifth connection electrode 405, a sixth connection electrode 406, a seventh connection electrode 407, an eighth connection electrode 408, a ninth connection electrode 409, a tenth connection electrode 410, an eleventh connection electrode 411, and a twelfth connection electrode 412).

In some exemplary implementations as shown in FIG. 8G, the second electrode T62 of the sixth transistor T6 and the second electrode T72 of the seventh transistor T7 may be of an integral structure. The second electrode T21 of the second transistor T2 and the second electrode T81 of the eighth transistor T8 may be of an integral structure. However, this embodiment is not limited thereto.

In some exemplary implementations as shown in FIG. 8G, the first electrode T11 of the first transistor T1 is electrically connected with the initial connection line 302 through the fifteenth via hole K15, and is also electrically connected with a first doped region of the active layer T10 of the first transistor T1 through the first via hole K1. The first electrode T41 of the fourth transistor T4 is electrically connected with a first doped region of the active layer T40 of the fourth transistor T4 through the fourth via hole K4. The first electrode T51 of the fifth transistor T5 is electrically connected with a first doped region of the active layer T50 of the fifth transistor T5 through the fifth via hole K5, and is also electrically connected with the second electrode C1-2 of the first storage capacitor C1 through the eighteenth via hole K18. The second electrode T62 of the sixth transistor T6 is electrically connected with a second doped region of the active layer T60 of the sixth transistor T6 through the sixth via hole K6. The second electrode T72 of the second transistor T7 is electrically connected with a second doped region of the active layer T70 of the seventh transistor T7 through the second via hole K2. The first electrode T21 of the second transistor T2 is electrically connected with a first doped region of the active layer T20 of the second transistor T2 through the third via hole K3. The first electrode T81 of the eighth transistor T8 is electrically connected with a first doped region of the active layer T80 of the eighth transistor T8 through the nineteenth via hole K19. The second electrode T82 of the eighth transistor T8 is electrically connected with a second doped region of the active layer T80 of the eighth transistor T8 through the twentieth via hole K20, and is also electrically connected with the first electrode C1-1 of the first storage capacitor C1 through the seventh via hole K7.

In some exemplary implementations as shown in FIG. 8G, the first connection electrode 401 is electrically connected with one end of the reset connection line 201 through the eighth via hole K8, and the second connection electrode 402 is electrically connected with another end of the reset connection line 201 through the ninth via hole K9. The third connection electrode 403 is electrically connected with one end of the first scan connection line 202 through the tenth via hole K10, and the fourth connection electrode 404 is electrically connected with another end of the first scan connection line 202 through the eleventh via hole K11. The fifth connection electrode 405 is electrically connected to one end of the light emitting connection line 203 through the twelfth via hole K12, and the sixth connection electrode 406 is electrically connected with another end of the light emitting connection line 203 through the thirteenth via hole K13. The seventh connection electrode 407 is electrically connected with one end of the second scan connection line 301 through the sixteenth via hole K16, and the eighth connection electrode 408 is electrically connected with another end of the second scan connection line 301 through the seventeenth via hole K17. The ninth connection electrode 409 is electrically connected with one end of the control electrode T83 of the eighth transistor T8 through the twenty-first via hole K21, and the tenth connection electrode 410 is electrically connected with another end of the control electrode T83 of the eighth transistor T8 through the twenty-second via hole K22. The seventh connection electrode 407 is adjacent to the ninth connection electrode 409 and the eighth connection electrode 408 is adjacent to the tenth connection electrode 410. The eleventh connection electrode 411 is electrically connected with one end of the initial connection line 302 through the fourteenth via hole K14. An orthographic projection of the twelfth connection electrode 412 on the base substrate is overlapped with an orthographic projection of the initial connection line 302 on the base substrate and an orthographic projection of the reset connection line 201 on the base substrate and is not overlapped with an orthographic projection of the first semiconductor layer on the base substrate. However, this embodiment is not limited thereto.

Figure 8H:
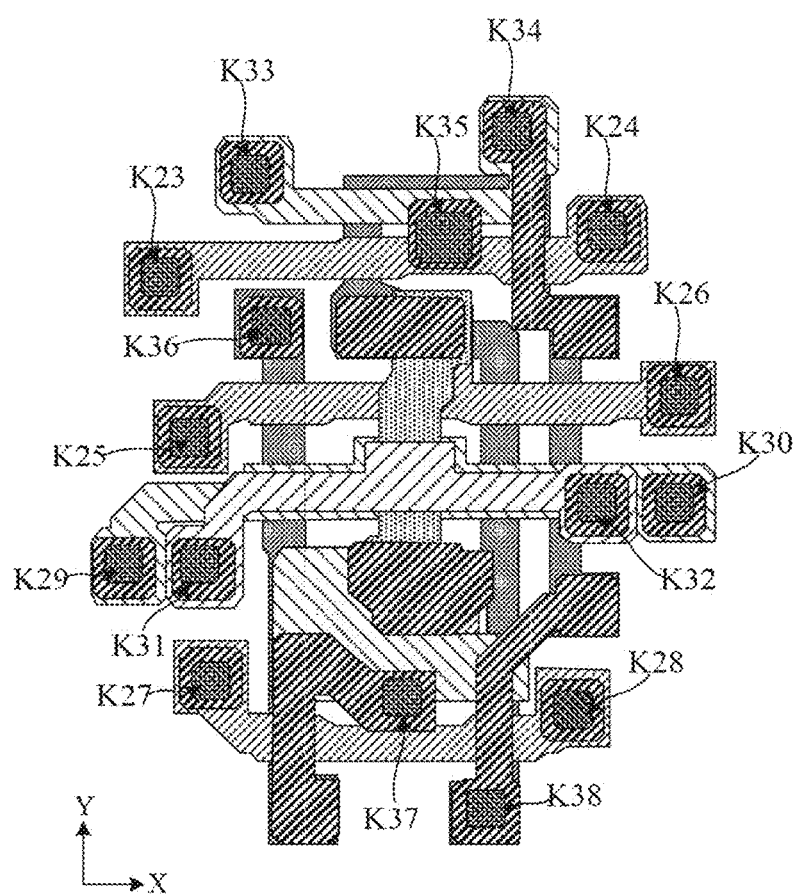
FIG. 8H is a plane schematic diagram of a part of a first display region after forming a sixth insulating layer according to at least one embodiment of the present disclosure.

FIG. 8H is a plane schematic diagram of a part of a first display region after forming a sixth insulating layer according to at least one embodiment of the present disclosure. In some exemplary implementations as shown in FIG. 8H, a plurality of via holes are formed on the sixth insulating layer in the first display region, and the plurality of via holes may at least include a twenty-third via hole K23 to a thirty-eighth via hole K38. The sixth insulating layers 36 within the twenty-third via hole K23 through the thirty-eighth via hole K38 are etched off to expose a surface of the fourth conductive layer.

Figure 8I:
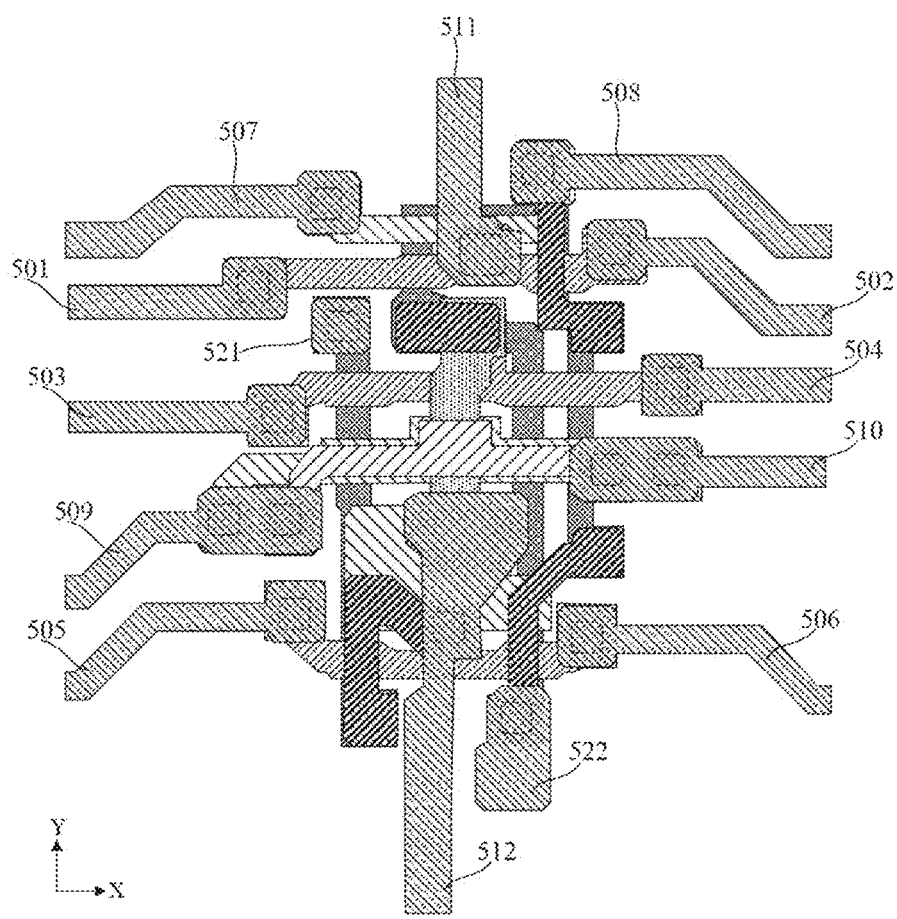
FIG. 8I is a plane schematic diagram of a part of a first display region after forming a first transparent conductive layer according to at least one embodiment of the present disclosure.

FIG. 8I is a plane schematic diagram of a part of a first display region after forming a first transparent conductive layer according to at least one embodiment of the present disclosure. In some exemplary implementations as shown in FIG. 8I, the first transparent conductive layer of the first display region may include a plurality of sub-signal lines (e.g., sub-initial signal lines 507 and 508, sub-reset control lines 501 and 502, first sub-scan lines 503 and 504, sub-light emitting control lines 505 and 506, second sub-scan lines 509 and 510), sub-power lines 511 and 512, a first data connection electrode 521, and a first anode connection electrode 522. A plurality of sub-signal lines extend in the first direction X and the sub-power lines 511 and 512 extend in the second direction Y.

In some exemplary implementations as shown in FIG. 8I, the sub-reset control line 501 is electrically connected with the first connection electrode 401 through the twenty-third via hole K23, and the sub-reset control line 502 is electrically connected with the second connection electrode 402 through the twenty-fourth via hole K24. The first sub-scan line 503 is electrically connected with the third connection electrode 403 through the twenty-fifth via hole K25, and the first sub-scan line 504 is electrically connected with the fourth connection electrode 404 through the twenty-sixth via hole K26. The sub-light emitting control line 505 is electrically connected with the fifth connection electrode 405 through the twenty-seventh via hole K27, and the sub-light emitting control line 506 is electrically connected with the sixth connection electrode 406 through the twenty-eighth via hole K28. The second sub-scan line 509 is electrically connected with the seventh connection electrode 407 through the twenty-ninth via hole K29, and is also electrically connected with the ninth connection electrode 409 through the thirty-first via hole K31. The second sub-scan line 510 is electrically connected with the eighth connection electrode 408 through the thirtieth via hole K30 and is also electrically connected with the tenth connection electrode 410 through the thirty-second via hole K32. The sub-initial signal line 507 is electrically connected with the eleventh connection electrode 411 through the thirty-third via hole K33. The sub-initial signal line 508 is electrically connected with the first electrode T11 of the first transistor T1 through the thirty-fourth via hole K34. The sub-power line 511 is electrically connected with the twelfth connection electrode 412 through the thirty-fifth via hole K35. The sub-power line 512 is electrically connected with the first electrode T51 of the fifth transistor T5 through the thirty-seventh via hole K37. The first data connection electrode 521 is electrically connected with the first electrode T41 of the fourth transistor T4 through the thirty-sixth via hole K36. The first anode connection electrode 522 is electrically connected with the second electrode T62 of the sixth transistor T6 through the thirty-eighth via hole K38.

In some exemplary implementations, in the first direction X of the first display region, adjacent sub-initial signal lines 507 and 508 of the initial signal line may be electrically connected through the eleventh connection electrode 411, the first electrode T11 of the first transistor T1, and the initial connection line 301. Sub-reset control lines 501 and 502 adjacent to the reset control line may be electrically connected through the first connection electrode 401, the second connection electrode 402 and the reset connection line 201. The first sub-scan lines 503 and 504 adjacent to the first scan line may be electrically connected through the third connection electrode 403, the fourth connection electrode 404 and the first scan connection line 202. The sub-light emitting control lines 505 and 506 adjacent to the light emitting control line may be electrically connected through the fifth connection electrode 405, the sixth connection electrode 406 and the light emitting connection line 203. The second sub-scan lines 509 and 510 adjacent to the second scan line may be electrically connected through the seventh connection electrode 407, the eighth connection electrode 408, the ninth connection electrode 409, the tenth connection electrode 410, the second scan connection line 301, and the control electrode T83 of the eighth transistor T8.

In this exemplary embodiment, an orthographic projection of the first scan line on the base substrate is located between an orthographic projection of the reset control line on the base substrate and an orthographic projection of the second scan line on the base substrate, the orthographic projection of the reset control line on the base substrate is located between an orthographic projection of the initial signal line on the base substrate and the orthographic projection of the first scan line on the base substrate, and an orthographic projection of the second scan line on the base substrate is located between the orthographic projection of the first scan line on the base substrate and an orthographic projection of the light emitting control line on the base substrate. In the first display region, a transparent conductive material is used to manufacture the first scan line, the second scan line, the initial signal line, the light emitting control line, the reset control line and the first power line, so that the transmittance in the first display region can be improved.

Figure 8J:
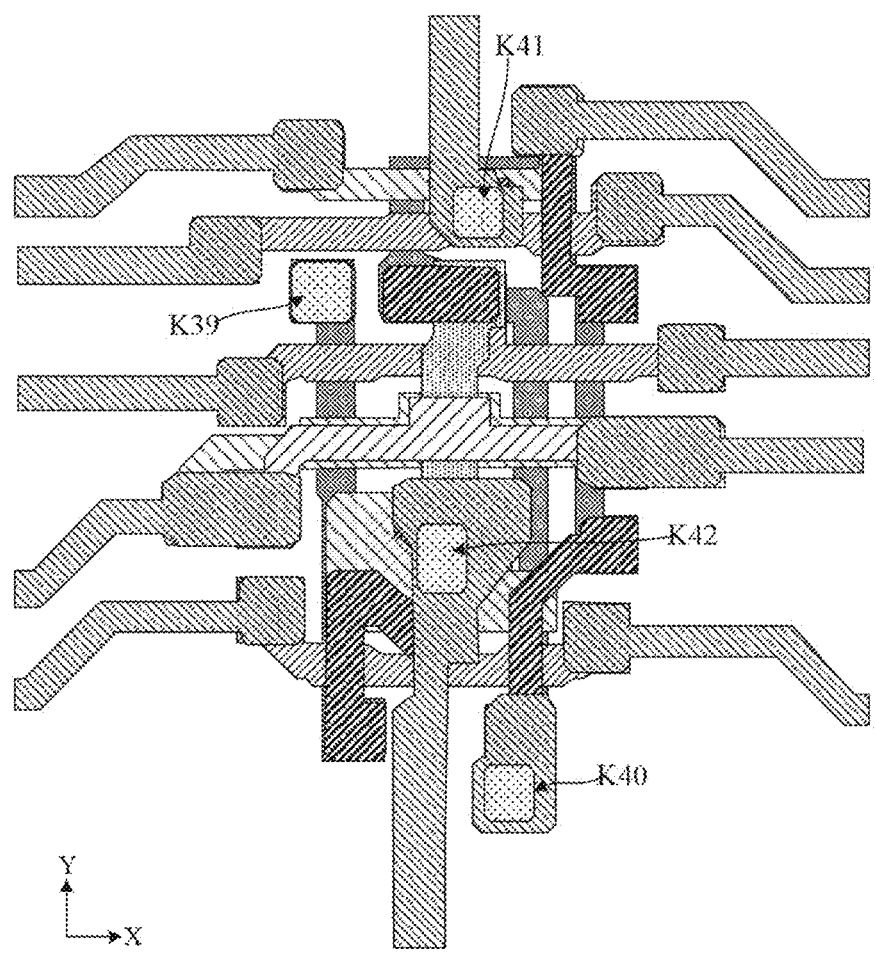
FIG. 8J is a plane schematic diagram of a part of a first display region after forming a seventh insulating layer according to at least one embodiment of the present disclosure.

FIG. 8J is a plane schematic diagram of a part of a first display region after forming a seventh insulating layer according to at least one embodiment of the present disclosure. In some exemplary implementations as shown in FIG. 8J, a plurality of via holes are formed on the seventh insulating layer in the first display region, and the plurality of via holes may at least include a thirty-ninth via hole K39 to a fourth-second via hole K42. The seventh insulating layers within the thirty-ninth via hole K39 through the forty-second via hole K42 are removed to expose a surface of the first transparent conductive layer.

Figure 8K:
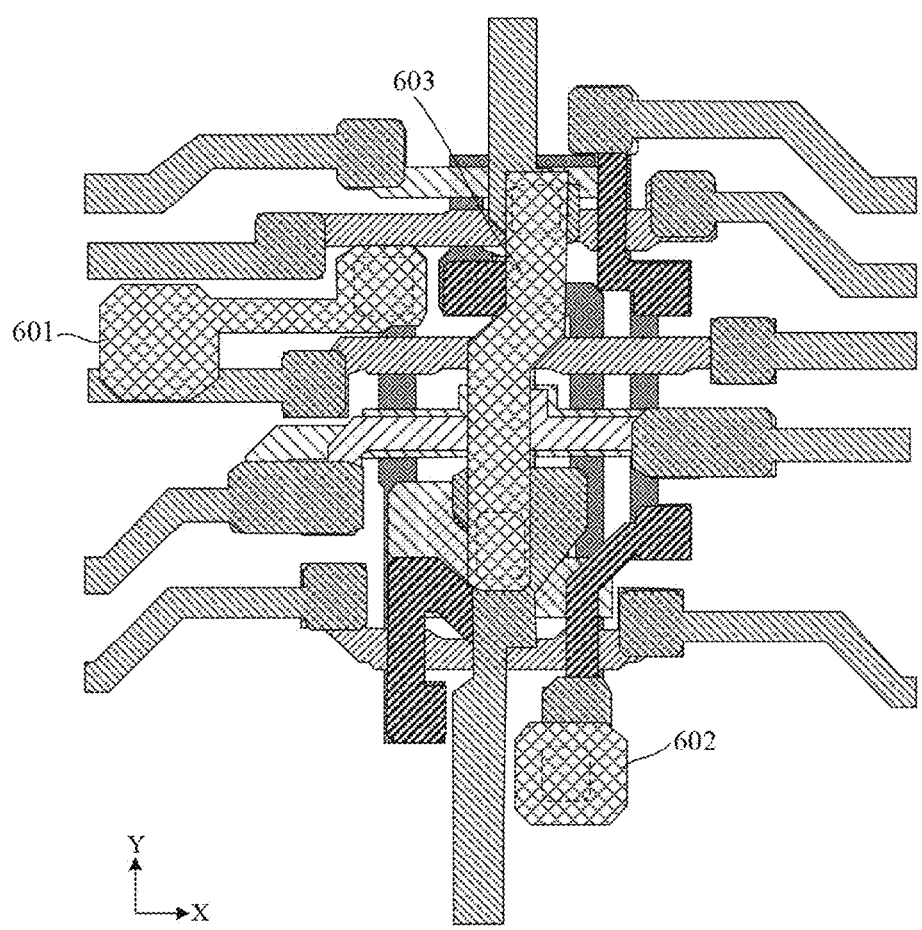
FIG. 8K is a plane schematic diagram of a part of a first display region after forming a first electrical connection layer according to at least one embodiment of the present disclosure.

FIG. 8K is a plane schematic diagram of a part of a first display region after forming a first electrical connection layer according to at least one embodiment of the present disclosure. In some exemplary implementations as shown in FIG. 8K, the first electrical connection layer in the first display region may include a second data connection electrode 601, a second anode connection electrode 602 and a power supply connection line 603. The power supply connection line 603 extends along the second direction Y. The second data connection electrode 601 extends along the first direction X.

In some exemplary implementations as shown in FIG. 8K, the second data connection electrode 601 is electrically connected with the first data connection electrode 521 through the thirty-ninth via hole K39. The second anode connection electrode 602 is electrically connected with the first anode connection electrode 522 through the fortieth via hole K40. One end of the power supply connection line 603 is electrically connected with the sub-power line 511 through the forty-first via hole K41, and another end is electrically connected with the sub-power line 512 through the forty-second via hole K42.

Figure 8L:
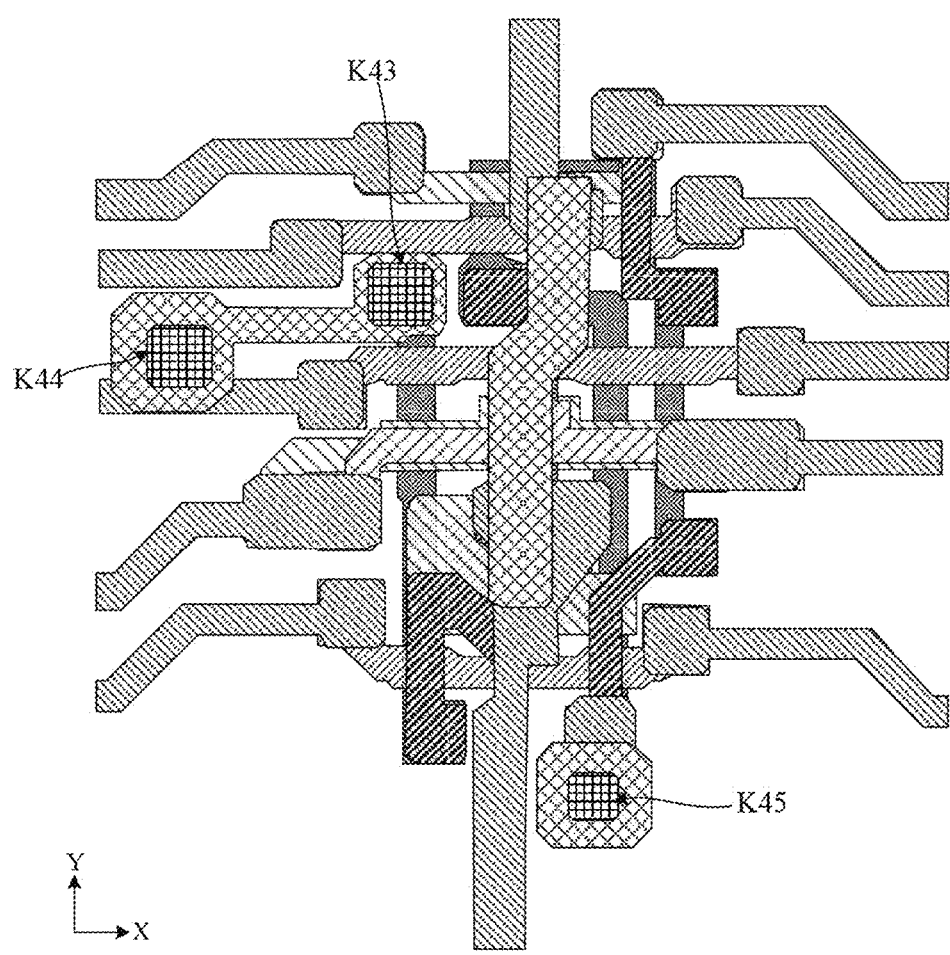
FIG. 8L is a plane schematic diagram of a part of a first display region after forming an eighth insulating layer according to at least one embodiment of the present disclosure.

FIG. 8L is a plane schematic diagram of a part of a first display region after forming an eighth insulating layer according to at least one embodiment of the present disclosure. In some exemplary implementations as shown in FIG. 8L, a plurality of via holes are opened on the eighth insulating layer in the first display region, and the plurality of via holes may at least include a forty-third via hole K43 to a forty-fifth via hole K45. The eighth insulating layers within the forty-third via hole K43 to the forty-fifth via hole K45 are removed to expose a surface of the first electrical connection layer.

Figure 8M:
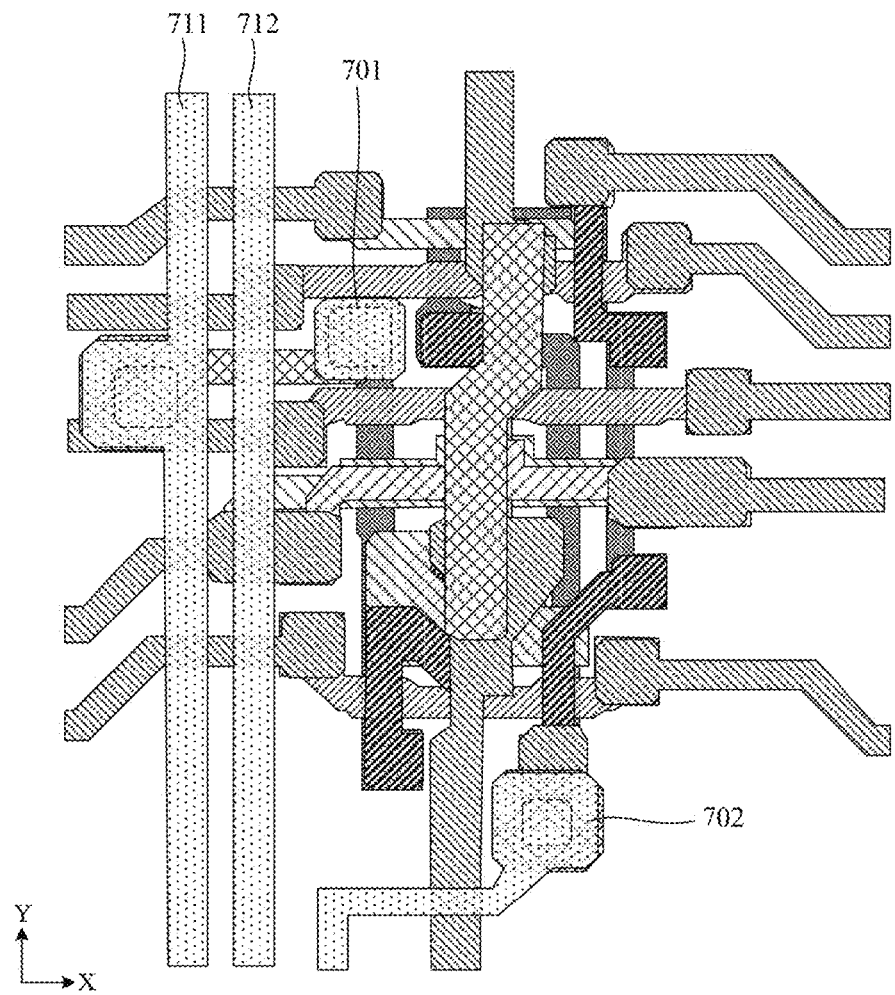
FIG. 8M is a plane schematic diagram of a part of a first display region after forming a second transparent conductive layer according to at least one embodiment of the present disclosure.

FIG. 8M is a plane schematic diagram of a part of a first display region after forming a second transparent conductive layer according to at least one embodiment of the present disclosure. In some exemplary implementations as shown in FIG. 8M, the second transparent conductive layer in the first display region may include a plurality of second signal lines (e.g. including a first data lines 711 and a second data lines 712), a third data connection electrode 701, and an anode connection line 702. Both of the first data line 711 and the second data line 712 extend along the second direction Y. The first data line 711 is electrically connected with the second data connection electrode 601 through the forty-fourth via hole K44, and the third data connection electrode 701 may be electrically connected with the second data connection electrode 601 through the forty-third via hole K43. The anode connection line 702 is electrically connected with the second anode connection electrode 602 through the forty-fifth via hole K45.

Figure 8N:
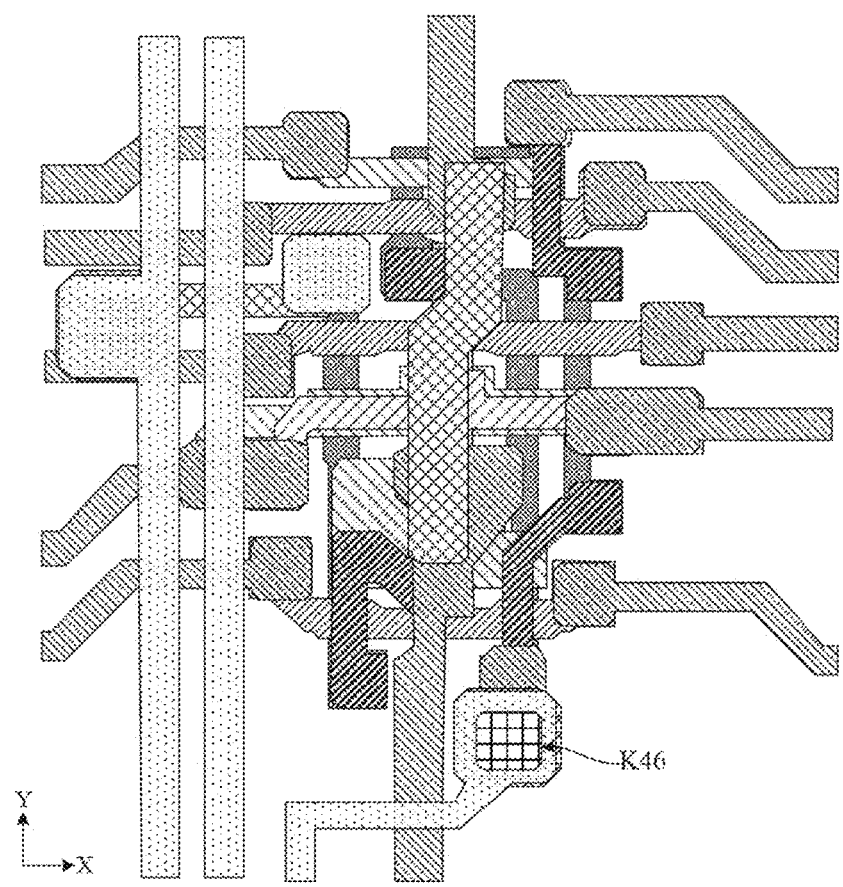
FIG. 8N is a plane schematic diagram of a part of a first display region after forming a ninth insulating layer according to at least one embodiment of the present disclosure.

FIG. 8N is a plane schematic diagram of a part of a first display region after forming a ninth insulating layer according to at least one embodiment of the present disclosure. In some exemplary implementations as shown in FIG. 8N, a plurality of via holes are opened on the ninth insulating layer in the first display region, and the plurality of via holes may include a forty-sixth via hole K46. The ninth insulating layer within the forty-sixth via hole K46 is removed to expose a surface of the second transparent conductive layer.

Figure 8O:
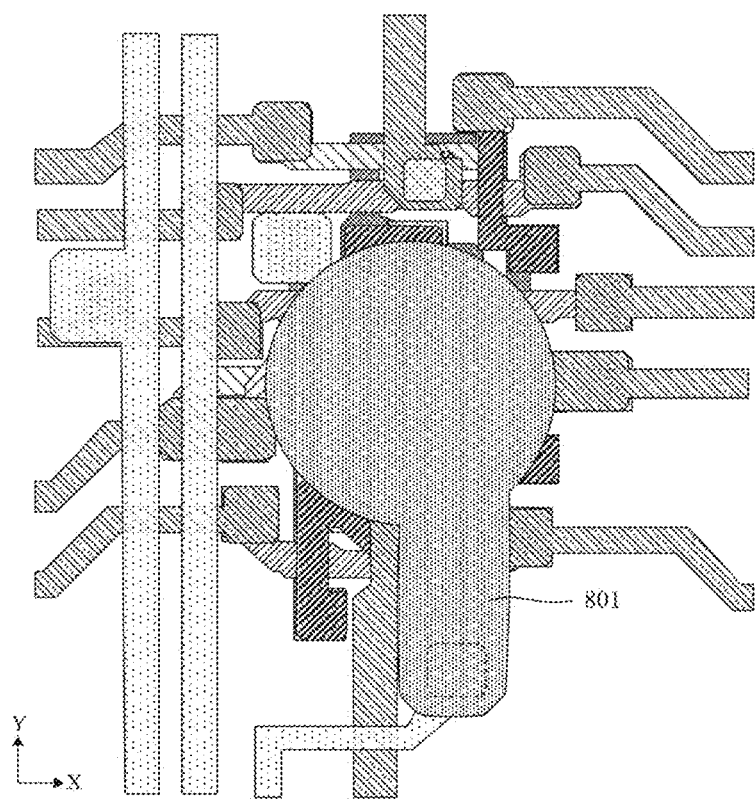
FIG. 8O is a plane schematic diagram of a part of a first display region after forming an anode layer according to at least one embodiment of the present disclosure.

FIG. 8O is a plane schematic diagram of a part of a first display region after forming an anode layer according to at least one embodiment of the present disclosure. In some exemplary implementations as shown in FIG. 8N, the anode layer in the first display region may include a first anode 801. The first anode 801 may be electrically connected with the anode connection line 702 through the forty-sixth via hole K46. The anode connection line 702 may also be electrically connected with an anode of another first light emitting element, thereby enabling the first pixel circuit to simultaneously drive the two first light emitting elements.

Figure 9A:
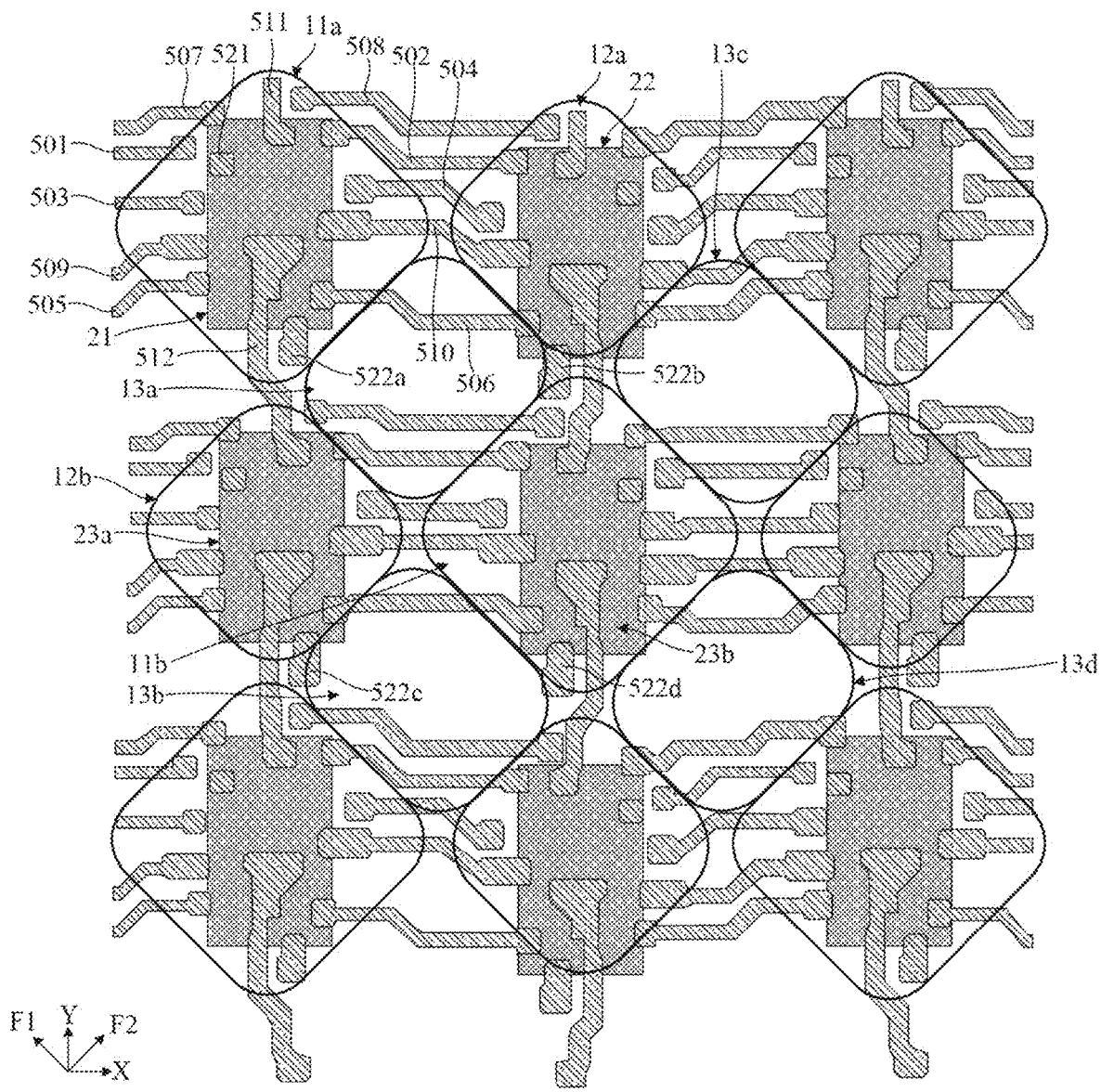
FIG. 9A is a plane schematic diagram of another part of a first display region after forming a first transparent conductive layer according to at least one embodiment of the present disclosure.
Figure 9B:
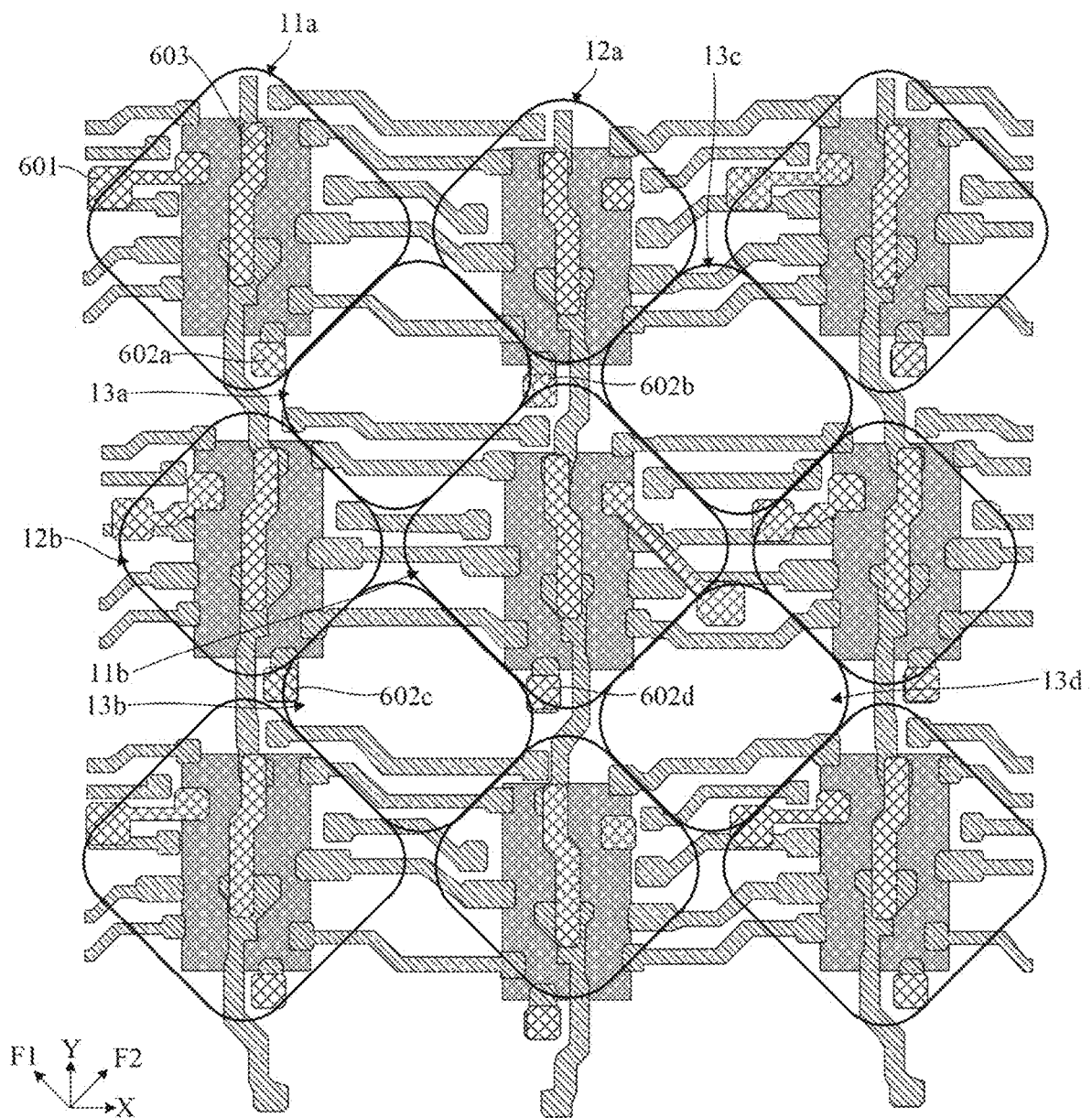
FIG. 9B is a plane schematic diagram of another part of a first display region after forming a first electrical connection layer according to at least one embodiment of the present disclosure.
Figure 9C:
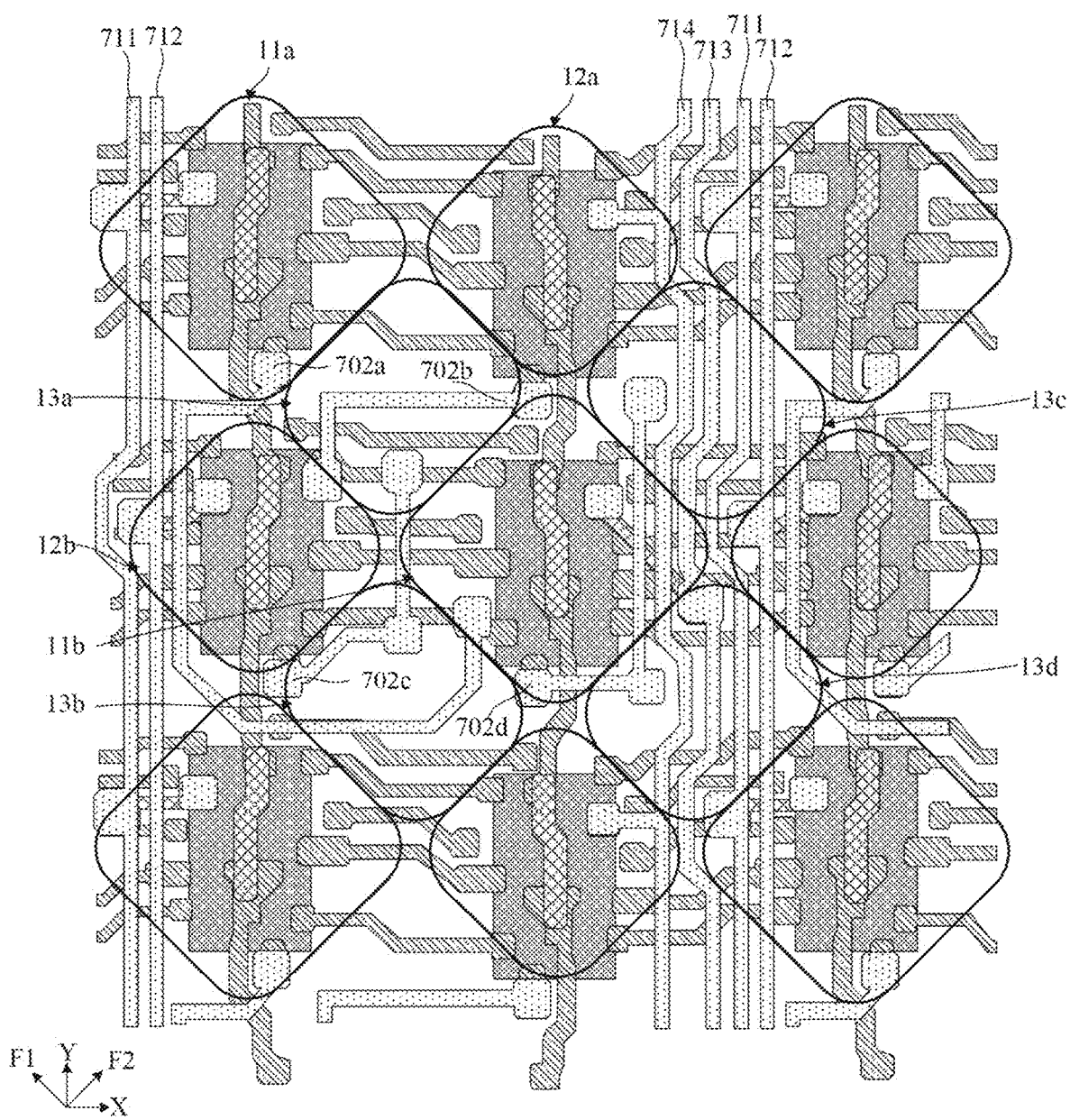
FIG. 9C is a plane schematic diagram of another part of a first display region after forming a second transparent conductive layer according to at least one embodiment of the present disclosure.
Figure 9D:
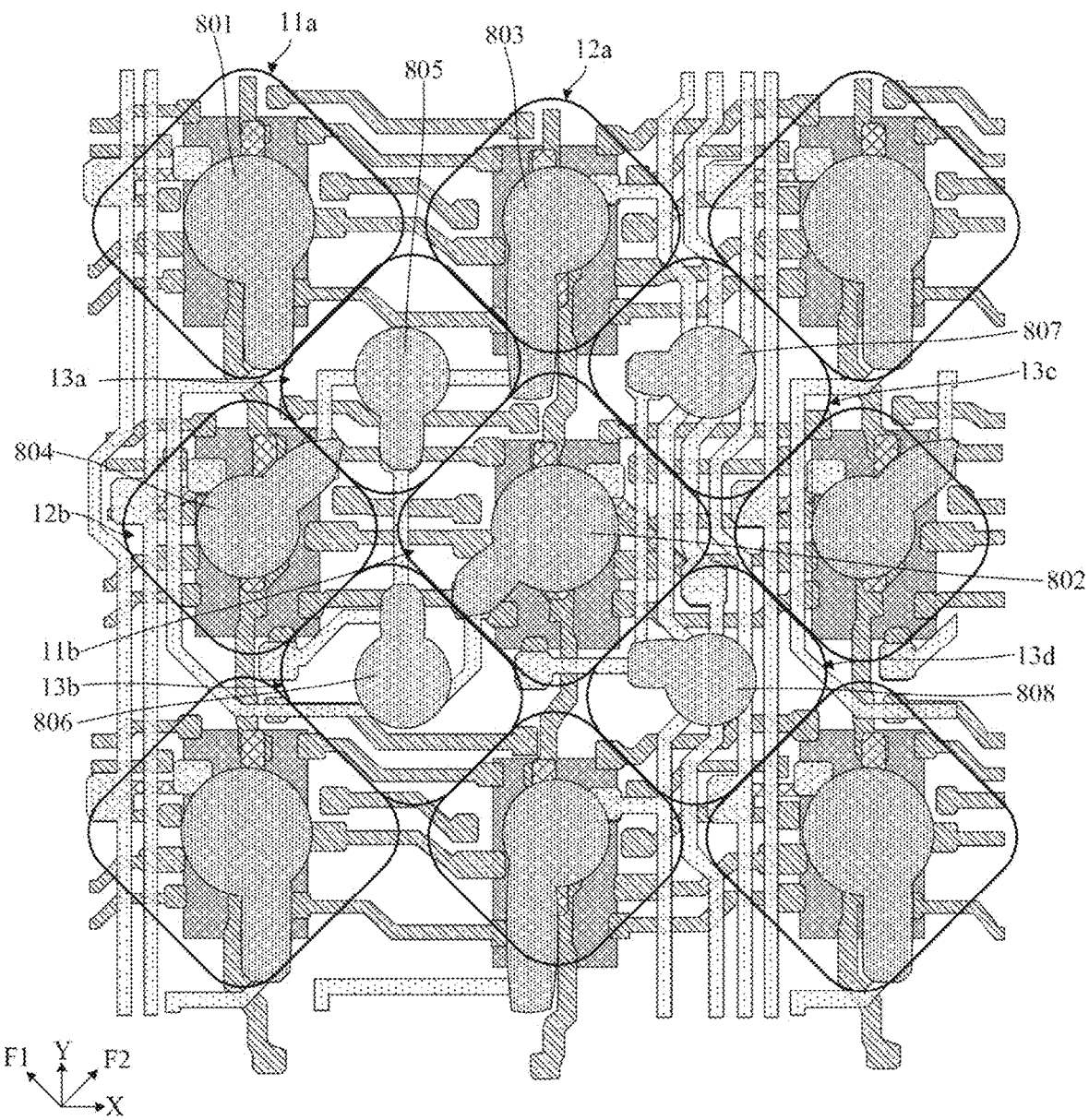
FIG. 9D is a plane schematic diagram of another part of a first display region after forming an anode layer according to at least one embodiment of the present disclosure.
Figure 9E:
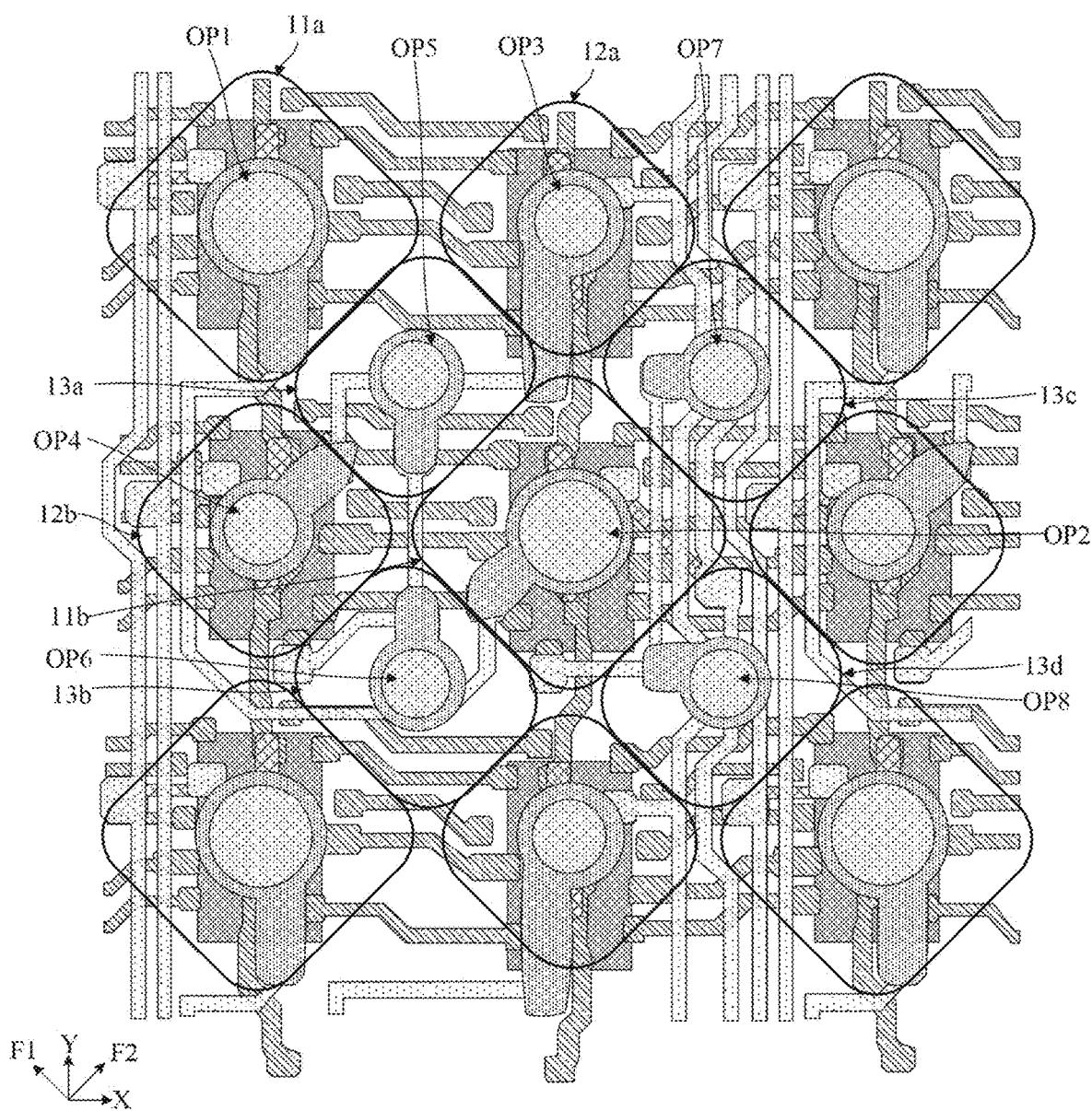
FIG. 9E is a plane schematic diagram of another part of a first display region after forming a pixel define layer according to at least one embodiment of the present disclosure.

FIG. 9A is a plane schematic diagram of another part of a first display region after forming a first transparent conductive layer according to at least one embodiment of the present disclosure. FIG. 9B is a plane schematic diagram of another part of a first display region after forming a first electrical connection layer according to at least one embodiment of the present disclosure. FIG. 9C is a plane schematic diagram of another part of a first display region after forming a second transparent conductive layer according to at least one embodiment of the present disclosure. FIG. 9D is a plane schematic diagram of another part of a first display region after forming an anode layer according to at least one embodiment of the present disclosure. FIG. 9E is a plane schematic diagram of another part of a first display region after forming a pixel define layer according to at least one embodiment of the present disclosure. A plurality of first-region light emitting elements (e.g. The first light emitting elements 11a and 11b, the second light emitting elements 12a and 12b and the third light emitting elements 13a to 13d) are illustrated in FIGS. 9A to 9E. Positions of the first-region pixel circuits (e.g. a first pixel circuit 21, a second pixel circuit 22, third pixel circuits 23a and 23b) of the circuit structure layer are illustrated with a rectangular frame in FIGS. 9A to 9E.

In some exemplary implementations as shown in FIGS. 9A to 9E, an orthographic projection of the first pixel circuit 21 on the base substrate is overlapped with an orthographic projection of the first light emitting element 11a on the base substrate, an orthographic projection of the second pixel circuit 22 on the base substrate is overlapped with an orthographic projection of the second light emitting element 12a on the base substrate, an orthographic projection of the third pixel circuit 23a on the base substrate is overlapped with an orthographic projection of the second light emitting element 12b on the base substrate, and an orthographic projection of the third pixel circuit 23b on the base substrate is overlapped with an orthographic projection of the first light emitting element 11b on the base substrate. There is no pixel circuit below the third light emitting elements 13a to 13d.

In some exemplary implementations as shown in FIG. 9A, the first transparent conductive layer of the first display region may include a plurality of sub-signal lines (e.g., the sub-initial signal lines 507 and 508, the sub-reset control lines 501 and 502, the first sub-scan lines 503 and 504, the sub-light emitting control lines 505 and 506, the second sub-scan lines 509 and 510), the sub-power lines 511 and 512, the first data connection electrode 521, and a plurality of first anode connection electrode (e.g., the first anode connection electrodes 522a, 522b, 522c and 522d). The sub-initial signal lines 507 and 508 can be electrically connected through the first pixel circuit 21, the sub-reset control lines 501 and 502 can be electrically connected through the first pixel circuit 21, the first sub-scan lines 503 and 504 can be electrically connected through the first pixel circuit 21, the sub-light emitting control lines 505 and 506 can be electrically connected through the first pixel circuit 21, and the second sub-scan lines 509 and 510 can be electrically connected through the first pixel circuit 21. In this example, a first signal line extending along the first direction X is provided in the first transparent conductive layer, so that the transmittance of the first display region can be improved and light diffraction can be prevented, which facilitate reducing diffraction of the camera under the first display region A1 of the display substrate during shooting, thereby improving the shooting effect.

In some exemplary implementations as shown in FIG. 9A, the sub-power line 512 may be electrically connected with the first pixel circuit 21 and extend along the second direction Y to an region where the third pixel circuit 23a is located. The first pixel circuit 21 and the third pixel circuit 23a are located in a same column and are electrically connected with a same first power line, and the second pixel circuit 22 and the third pixel circuit 23b are located in a same column and are electrically connected with a same first power line. In this example, the first power line extending along the second direction Y is provided in the first transparent conductive layer, which can improve the transmittance of the first display region and avoid interference to other traces.

In some exemplary implementations as shown in FIG. 9B, the first electrical connection layer in the first display region may include a plurality of second data connection electrodes (e.g., the second data connection electrodes 601), a plurality of power supply connection lines (e.g., the power supply connection lines 603), and a plurality of second anode connection electrodes (e.g., second anode connection electrodes 602a, 602b, 602c and 602d). The power supply connection line 603 may be electrically connected with the sub-power lines 511 and 512 through a via hole opened in the seventh insulating layer. The second data connection electrode 601 may be electrically connected with the first data connection electrode 521 through a via hole opened in the seventh insulating layer. The second anode connection electrode 602a may be electrically connected with the first anode connection electrode 522a through a via hole opened in the seventh insulating layer, the second anode connection electrode 602b may be electrically connected with the first anode connection electrode 522b through a via hole opened in the seventh insulating layer, the second anode connection electrode 602c may be electrically connected with the first anode connection electrode 522c through a via hole opened in the seventh insulating layer, and the second anode connection electrode 602d may be electrically connected with the first anode connection electrode 522d through a via hole opened in the seventh insulating layer.

In some exemplary implementations as shown in FIG. 9C, the second transparent conductive layer of the first display region may include a plurality of data lines (e.g. the first data line 711, the second data line 712, the third data line 713 and the fourth data line 714), a plurality of third data connection electrodes, and a plurality of anode connection lines (e.g. anode connection lines 702a, 702b, 702c and 702d). The third data connection electrode may be electrically connected with the second data connection electrode through a via hole opened in the eighth insulating layer. The first data line 711 may be electrically connected with a plurality of first pixel circuits (e.g. the first pixel circuit 21) through a via hole opened in the eighth insulating layer and is configured to provide data signals to the first pixel circuits. The second data line 712 may be electrically connected with a plurality of third pixel circuits (e.g. the third pixel circuit 23a) through a via hole opened in the eighth insulating layer and is configured to provide data signals to the third pixel circuits. The third data line 713 may be electrically connected with a plurality of third pixel circuits (e.g. the third pixel circuit 23b) through a via hole opened in the eighth insulating layer and is configured to provide data signals to the third pixel circuits. The fourth data line 714 may be electrically connected with a plurality of second pixel circuits (e.g. the second pixel circuit 22) through a via hole opened in the eighth insulating layer and is configured to provide data signals to the second pixel circuits.

In some exemplary implementations, first-region pixel circuits in a k-th column may include first pixel circuits 21 and third pixel circuits 23a sequentially arranged in the second direction Y, and first-region pixel circuits in a (k+1)-th column may include second pixel circuits 22 and third pixel circuits 23b sequentially arranged in the second direction Y. As shown in FIG. 9C, there is no data lines arranged between the first-region pixel circuits in the k-th column and the first-region pixel circuits in the (k+1)-th column, and there are four data lines (i.e., the first data line 711, the second data line 712, the third data line 713, and the fourth data line 714) arranged between the first-region pixel circuits in the (k+1)-th column and first-region pixel circuits in a (k+2)-th column. In the first direction X, the fourth data line 714, the third data line 713, the first data line 711 and the second data line 712 are sequentially arranged. Where k is an integer. However, this embodiment is not limited thereto.

In some exemplary implementations as shown in FIG. 9D, the anode layer in the first display region may include a plurality of anodes (e.g., a first anode 801, a second anode 802, a third anode 803, a fourth anode 804, a fifth anode 805, a sixth anode 806, a seventh anode 807, and an eighth anode 808).

In some exemplary implementations as shown in FIGS. 9C and 9D, the anode connection line 702a is electrically connected with the second anode connection electrode 602a through a via hole opened in the eighth insulating layer, and is also electrically connected with the first anode 801 of the first light emitting element 11a through a via hole opened in the ninth insulating layer. The anode connection line 702a extends sequentially in the second direction Y, the third direction F1, the first direction X, the fourth direction F2 and the second direction Y to a region where the first light emitting element 11b is located, and is electrically connected with the second anode 802 of the first light emitting element 11b through a via hole opened in the ninth insulating layer. The anode connection line 702b is electrically connected with the second anode connection electrode 602b through a via hole opened in the eighth insulating layer, and is also electrically connected with the third anode 803 of the second light emitting element 12a through a via hole opened in the ninth insulating layer. The anode connection line 702b extends sequentially in the first direction X and the second direction Y to a region where the second light emitting element 12b is located, and is electrically connected with the fourth anode 804 of the second light emitting element 12b through a via hole opened in the ninth insulating layer. The anode connection line 702c is electrically connected with the second anode connection electrode 602c through a via hole opened in the eighth insulating layer. The anode connection line 702c extends to a region where the third light emitting element 13b is located in the fourth direction F2 and the first direction X, and then extends to a region where the third light emitting element 13a is located in the second direction Y. The anode connection line 702c is electrically connected with the fifth anode 805 of the third light emitting element 13a through a via hole opened in the ninth insulating layer and is also electrically connected with the sixth anode 806 of the third light emitting element 13b. The anode connection line 702d is electrically connected with the second anode connection electrode 602d through a via hole opened in the eighth insulating layer. The anode connection line 702d extends to a region where the third light emitting element 13d is located in the first direction X, and then extends to a region where the third light emitting element 13c is located in the second direction Y. The anode connection line 702d is electrically connected with the seventh anode 807 of the third light emitting element 13c through a via hole opened in the ninth insulating layer and is also electrically connected with the eighth anode 808 of the third light emitting element 13d.

In the present exemplary implementation, the first pixel circuit 21 may be passed through the first anode connection electrode 522a, the second anode connection electrode 602a and the anode connection line 702a, enabling electrically connecting with the first anode 801 of the first light emitting element 11a and the second anode 802 of the first light emitting element 11b. The second pixel circuit 22 may be passed through the first anode connection electrode 522b, the second anode connection electrode 602b and the anode connection line 702b, enabling electrically connecting with the third anode 803 of the second light emitting element 12a and the fourth anode 804 of the second light emitting element 12b. The third pixel circuit 23a may be passed through the first anode connection electrode 522c, the second anode connection electrode 602c and the anode connection line 702c, enabling electrically connecting with the fifth anode 805 of the third light emitting element 13a and the sixth anode 806 of the third light emitting element 13b. The third pixel circuit 23d may be passed through the first anode connection electrode 522d, the second anode connection electrode 602d and the anode connection line 702d, enabling electrically connecting with the seventh anode 807 of the third light emitting element 13c and the eighth anode 808 of the third light emitting element 13d.

In some exemplary implementations as shown in FIG. 9E, a plurality of pixel openings (e.g. first pixel openings OP1 to eighth pixel openings OP8) may be opened in a pixel define layer of the first display region. The pixel define layers within the plurality of pixel openings are removed, exposing a surface of an anode. For example, the first pixel opening OP1 exposes a part of a surface of the first anode 801, the second pixel opening OP2 exposes a part of a surface of the second anode 802, the third pixel opening OP3 exposes a part of a surface of the third anode 803, the fourth pixel opening OP4 exposes a part of a surface of the fourth anode 804, the fifth pixel opening OP5 exposes a part of a surface of the fifth anode 805, the sixth pixel opening OP6 exposes a part of a surface of the sixth anode 806, the seventh pixel opening OP7 exposes a part of a surface of the seventh anode 807, and the eighth pixel opening OP8 exposes a part of a surface of the eighth anode 808. In some examples, an orthographic projection of the plurality of pixel openings on the base substrate may be circular or elliptical. However, this embodiment is not limited thereto.

The structure of the display substrate will be described below through an example of a manufacturing process of the display substrate. The "patterning process" mentioned in the embodiments of the present disclosure includes processes, such as photoresist coating, mask exposure, development, etching and photoresist stripping for metal materials, inorganic materials or transparent conductive materials, and includes organic material coating, mask exposure and development for organic materials. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film formed by a material on a base substrate through deposition, coating, or other processes. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern".

In some exemplary embodiments, a manufacturing process of a display substrate may include following operations.

(1) A base substrate is provided.

In some exemplary implementations, the base substrate 30 may be a rigid base substrate, e.g., a glass base substrate. However, this embodiment is not limited thereto. For example, the base substrate may be a flexible base substrate.

(2) A first semiconductor layer is formed.

In some exemplary implementations, a first semiconductor film is deposited on the base substrate 30, and the first semiconductor film is patterned by a patterning process to form a first semiconductor layer, as shown in FIG. 8A. In some examples, a material of the first semiconductor thin film may be poly-silicon.

(3) A pattern of a first conductive layer is formed.

In some exemplary implementations, a first insulating thin film and a first conductive thin film are sequentially deposited on the base substrate 30 where the aforementioned structure is formed, and the first conductive thin film is patterned by a patterning process to form a first insulating layer 31 covering the first semiconductor layer and the first conductive layer disposed on the first insulating layer 31, as shown in FIG. 8B.

In some exemplary implementations, after a pattern of the first conductive layer is formed, the first conductive layer may be used as a shield to perform a conductive treatment on the first semiconductor layer. The first semiconductor layer in a region shielded by the first conductive layer forms channel regions of a plurality of transistors, and the first semiconductor layer in a region not shielded by the first conductive layer is made to be conductive, that is, the first doped regions and the second doped regions of the first active layer T10 of the first transistor T1 through the seventh active layer T70 of the seventh transistor T7 are all made to be conductive.

(4) A second conductive layer is formed.

In some exemplary implementations, a second insulating thin film and a second conductive thin film are sequentially deposited on the base substrate 30 where the aforementioned structure is formed, and the second conductive thin film is patterned by a patterning process to form a second insulating layer 32 covering the first conductive layer and the second conductive layer disposed on the second insulating layer 32, as shown in FIG. 8C.

(5) A second semiconductor layer is formed.

In some exemplary implementations, a third insulating thin film and a second semiconductor thin film are sequentially deposited on the base substrate 30 where the above-mentioned patterns are formed, and the second semiconductor thin film is patterned by a patterning process to form a third insulating layer 33 covering the first conductive layer and the second semiconductor layer disposed on the third insulating layer 33, as shown in FIG. 8D. In some examples, the material of the second semiconductor thin film may be IGZO.

(6) A third conductive layer is formed.

In some exemplary implementations, a third insulating thin film and a third conductive thin film are sequentially deposited on the base substrate 30 where the aforementioned patterns is formed, and the second semiconductor thin film is patterned by a patterning process to form a third insulating layer 33 covering the second semiconductor layer and the third conductive layer disposed on the third insulating layer 33, as shown in FIG. 8E.

(7) A fifth insulating layer is formed.

In some exemplary implementations, a fifth insulating thin film is deposited on the base substrate 30 where the aforementioned patterns are formed, and the fifth insulating thin film is patterned by a patterning process to form a fifth insulating layer 35, as shown in FIG. 8F.

(8) A fourth conductive layer is formed.

In some exemplary implementations, a fourth conductive thin film is deposited on the base substrate 30 where the aforementioned patterns are formed, and the fourth conductive thin film is patterned by a patterning process to form a fourth conductive layer on the fifth insulating layer 35, as shown in FIG. 8G.

(9) A sixth insulating layer is formed.

In some exemplary implementations, a sixth insulating thin film is deposited on the base substrate 30 where the aforementioned patterns are formed, and the sixth insulating thin film is patterned by a patterning process to form a sixth insulating layer 36, as shown in FIG. 8H.

(10) A first transparent conductive layer is formed.

In some exemplary implementations, a first transparent conductive thin film is deposited on the base substrate 30 where the aforementioned patterns are formed, and the first transparent conductive thin film is patterned by a patterning process to form a first transparent conductive layer on the sixth insulating layer 36, as shown in FIGS. 8I and 9A.

(11) A seventh insulating layer is formed.

In some exemplary implementations, a seventh insulating thin film is coated on the base substrate 30 where the aforementioned patterns are formed, and the seventh insulating thin film is patterned by a patterning process to form a seventh insulating layer 37, as shown in FIG. 8J.

(12) A first electrical connection layer is formed.

In some exemplary implementations, a sixth conductive thin film is deposited on the base substrate 30 where the aforementioned patterns are formed, and the sixth conductive thin film is patterned by a patterning process to form a first electrical connection layer on the seventh insulating layer 37, as shown in FIGS. 8K and 9B.

(13) An eighth insulating layer is formed.

In some exemplary implementations, an eighth insulating thin film is coated on the base substrate 30 where the aforementioned patterns are formed, and the eighth insulating thin film is patterned by a patterning process to form an eighth insulating layer 38, as shown in FIG. 8L.

(14) A second transparent conductive layer is formed.

In some exemplary implementations, a second transparent conductive thin film is deposited on the base substrate 30 where the aforementioned patterns are formed, and the second transparent conductive thin film is patterned by a patterning process to form the second transparent conductive layer on the eighth insulating layer 38, as shown in FIGS. 8M and 9C.

(15) A ninth insulating layer is formed.

In some exemplary implementations, a ninth insulating thin film is coated on the base substrate 30 where the aforementioned patterns are formed, and the ninth insulating thin film is patterned by a patterning process to form a ninth insulating layer 39, as shown in FIG. 8N.

(16) An anode layer is formed.

In some exemplary implementations, an anode thin film is deposited on the base substrate 30 where the aforementioned patterns are formed, and the anode thin film is patterned by a patterning process to form an anode layer, as shown in FIGS. 8O and 9D.

(17) A pixel define layer is formed.

In some exemplary implementations, a pixel define thin film is coated on the base substrate 30 where the aforementioned patterns are formed, and a Pixel Define Layer (PDL) 40 is formed by masking, exposure and development processes, as shown in FIGS. 6 and 9E. A plurality of pixel openings exposing the anode layer is formed on the pixel define layer 40.

In some exemplary implementations, organic light emitting layers are formed within the previously formed pixel openings, and the organic light emitting layers are connected with the anode. Then, a cathode thin film is deposited and patterned by a patterning process to form a pattern of a cathode. The cathode is electrically connected with the organic emitting layer and the second power line respectively. Then, an encapsulation layer is formed on the cathode. The encapsulation layer may include a stacked structure of an inorganic material/an organic material/an inorganic material.

In some exemplary implementations, the first conductive layer, the second conductive layer, the third conductive layer, the fourth conductive layer and the first electrical connection layer may be made of metal materials, such as any one or more of silver (Ag), copper (Cu), aluminum (Al) and molybdenum (Mo), or alloy materials of the above metals, such as an aluminum neodymium alloy (AlNd) or a molybdenum niobium alloy (MoNb), and may be of a single-layer structure or a multi-layer composite structure, such as Mo/Cu/Mo, etc. The first insulating layer 31, the second insulating layer 32, the third insulating layer 33, the fourth insulating layer 34, the fifth insulating layer 35 and the sixth insulating layer 36 may be made of any one or more of Silicon Oxide (SiOx), Silicon Nitride (SiNx), and Silicon OxyNitride (SiON), and may be a single layer, a multi-layer, or a composite layer. The first through fourth insulating layers 31 through 34 may be referred to as Gate Insulating (GI) layers, the fifth insulating layer 35 may be referred to as an Interlayer Insulating (ILD) layer, and the sixth insulating layer 36 may be referred to as a passivation layer. The seventh insulating layer 37, the eighth insulating layer 38 and the ninth insulating layer 39 may be made of an organic material, such as polyimide, acrylic, or polyethylene terephthalate. The seventh insulating layer 37, the eighth insulating layer 38 and the ninth insulating layer 39 may be referred to as flat layers. The pixel define layer may be made of an organic material, such as polyimide, acrylic, or polyethylene terephthalate. The anode layer may be made of a reflective material such as a metal, and the cathode may be made of a transparent conductive material. However, this embodiment is not limited thereto.

In the display substrate provided in the exemplary implementation, a first signal line extending along a first direction and a first power line extending along a second direction are arranged by using a first transparent conductive layer, and a data line and an anode connection line are arranged by using the second transparent conductive layer, so that the transmittance of the first display region can be improved and light diffraction can be reduced. Moreover, the first electrical connection layer is disposed between the first transparent conductive layer and the second transparent conductive layer, which is beneficial to mutual connection between traces, simplifies a punching process and reduces a punching depth.

A structure and the manufacturing process of the display substrate of this embodiment are merely illustrative. In some exemplary implementations, corresponding structures may be altered and patterning processes may be increased or decreased according to actual needs. For example, the first power line is directly arranged on the first transparent conductive layer without disposing the first electrical connection layer; alternatively, the second semiconductor layer may be located between the first conductive layer and the second conductive layer without disposing the third conductive layer; alternatively, the first electrical connection layer may be located on a side of the first transparent conductive layer adjacent to the base substrate. However, this embodiment is not limited thereto.

The manufacturing process of the exemplary embodiment may be implemented using an existing mature manufacturing device, and may be compatible well with an existing manufacturing process, simple in process implementation, easy to implement, high in a production efficiency, low in a production cost, and high in a yield.

In some exemplary embodiments, the structure of the second-region pixel circuit in the second display region may be substantially the same as the structure of the first-region pixel circuit, and the structure and arrangement of the second-region light emitting elements in the second display region may be substantially the same as the structure and arrangement of the first-region light emitting elements, and thus will not be repeated here.

In some exemplary implementations, the first-region pixel circuit in the first display region may be of a 7T1C structure, and the first-region pixel circuit includes seven transistors which may be of a same type, for example, all of the seven transistors are low temperature poly-silicon thin film transistors.

Figure 10:
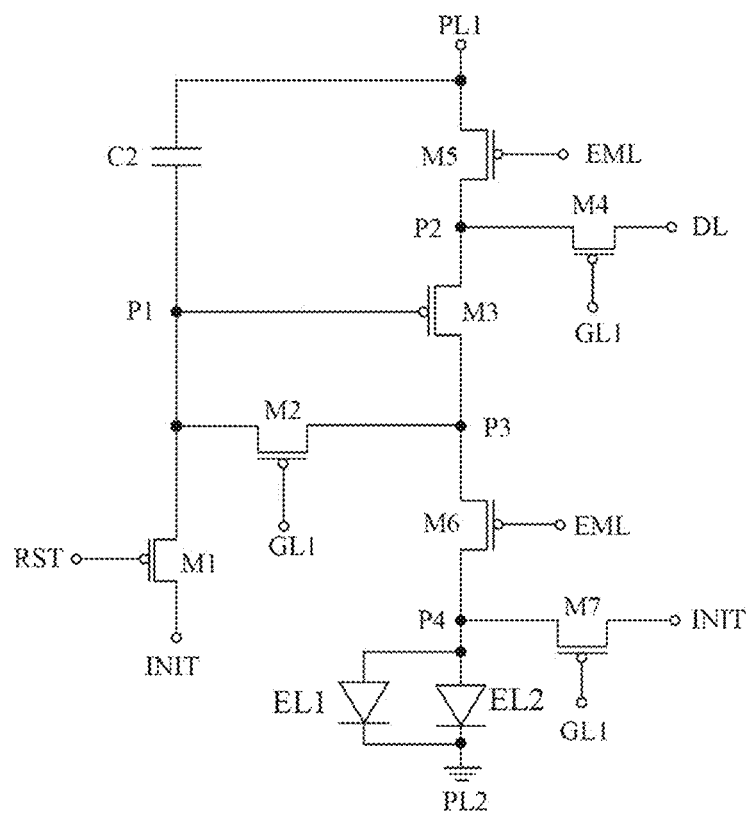
FIG. 10 is an equivalent circuit diagram of a first-region pixel circuit according to at least one embodiment of the present disclosure.
Figure 11:
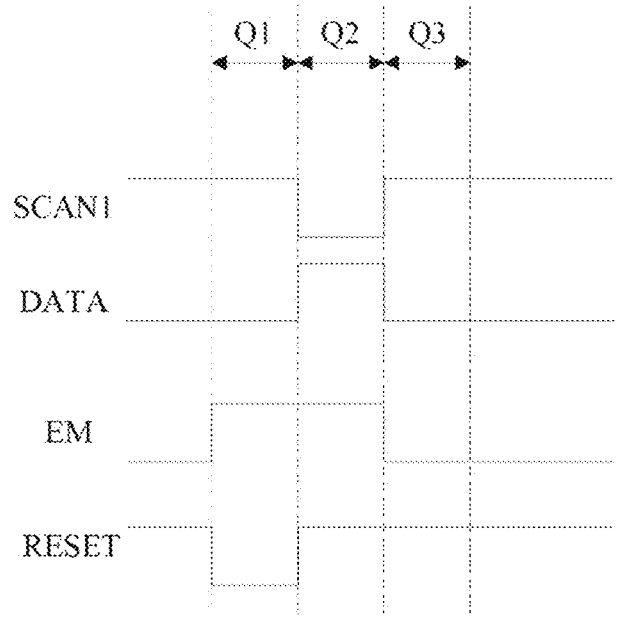
FIG. 11 is a timing diagram illustrating the working of the first-region pixel circuit provided in FIG. 10.

FIG. 10 is an equivalent circuit diagram of a first-region pixel circuit according to at least one embodiment of the present disclosure. FIG. 11 is a timing diagram illustrating the working of the first-region pixel circuit provided in FIG. 10.

In some exemplary implementations as shown in FIG. 10, the pixel circuit according to this exemplary embodiment may include six switching transistors (M1, M2, and M4 through M7), a drive transistor M3, and a second storage capacitor C2. The six switching transistors are respectively a data writing transistor M4, a threshold compensation transistor M2, a first light emitting control transistor M5, a second light emitting control transistor M6, a first reset transistor M1, and a second reset transistor M7. The first-region light emitting elements EL1 and EL2 may each include an anode, a cathode, and an organic light emitting layer located between the anode and the cathode.

In some exemplary implementations, the drive transistor and the six switching transistors may be P-type transistors or may be N-type transistors. Adopting a same type of transistors in a pixel circuit may simplify a process flow, reduce a process difficulty of a display substrate, and improve a yield of products. The drive transistor and the six switching transistors may be low temperature poly-silicon thin film transistors, or oxide thin film transistors.

In some exemplary implementations as shown in FIG. 10, a control electrode of the drive transistor M3 is electrically connected with a sixth node P1, a first electrode of the drive transistor M3 is electrically connected with a seventh node P2, and a second electrode of the drive transistor M3 is electrically connected with an eighth node P3. A control electrode of the data writing transistor M4 is electrically connected with the first scan line GL1, a first electrode of the data writing transistor M4 is electrically connected with the data line DL, and a second electrode of the data writing transistor M4 is electrically connected with a first electrode of the drive transistor M3. A control electrode of the threshold compensation transistor M2 is electrically connected with the scan line GL, a first electrode of the threshold compensation transistor T2 is electrically connected with the control electrode of the drive transistor T3, and a second electrode of the threshold compensation transistor M2 is electrically connected with a second electrode of the drive transistor M3. A control electrode of the first light emitting control transistor M5 is electrically connected with the light emitting control line EML, a first electrode of the first light emitting control transistor M5 is connected with the first power line PL1, and a second electrode of the first light emitting control transistor M5 is connected with the first electrode of the drive transistor M3. A control electrode of the second light emitting control transistor M6 is electrically connected with the light emitting control line EML, a first electrode of the second light emitting control transistor M6 is electrically connected with the second electrode of the drive transistor M3, and a second electrode of the second light emitting control transistor M6 is electrically connected with a ninth node P4. A control electrode of the first reset transistor M1 is electrically connected with the reset control line RST, a first electrode of the first transistor T1 is electrically connected with the initial signal line INIT, and a second electrode of the first transistor T1 is electrically connected with the control electrode of the drive transistor M3. A control electrode of the second reset transistor M7 is electrically connected with the first scan line GL1, a first electrode of the second reset transistor M7 is electrically connected with the initial signal line INIT, and a second electrode of the second reset transistor M7 is electrically connected with the fourth node P4. A first electrode of the second storage capacitor C2 is electrically connected with the control electrode of the drive transistor M3, and a second electrode of the second storage capacitor C2 is electrically connected with the first power line PL1.

In this example, the sixth node P1 is a connection point of the second storage capacitor C2, the first reset transistor M1, the drive transistor M3 and the threshold compensation transistor M2, the seventh node P2 is a connection point of the first light emitting control transistor M5, the data writing transistor M4 and the drive transistor M3, the eighth node P3 is a connection point of the drive transistor M3, the threshold compensation transistor M2, and the second light emitting control transistor M6, and the ninth node P4 is a connection point of the second light emitting control transistor M6, the second reset transistor M7, and the two first-region light emitting elements EL1 and EL2.

A working process of the first-region pixel circuit illustrated in FIG. 10 will be described below with reference to FIG. 11. The first-region pixel circuit shown in FIG. 10 includes a plurality of transistors which are all P-type transistors as an example.

In some exemplary implementations as shown in FIGS. 10 and 11, during a display period of one frame, the working process of the first-region pixel circuit may include a first stage Q1, a second stage Q2 and a third stage Q3.

The first stage Q1 is referred to as a reset stage. The reset control signal RESET provided by the reset control line RST is a low-level signal, so that the first reset transistor M1 is turned on, and the initial signal provided by the initial signal line INIT is provided to the sixth node P1 to initialize the sixth node P1. The first scan signal SCAN1 provided by the first scan line GL1 is a high-level signal, and the light emitting control signal EM provided by the light emitting control line EML is a high-level signal, so that the data writing transistor M4, the threshold compensation transistor M2, the first light emitting control transistor M5, the second light emitting control transistor M6, and the second reset transistor M7 are turned off. At this stage, the first-region light emitting elements EL1 and EL2 do not emit light.

The second stage Q2 is referred to as a data writing stage or a threshold compensation stage. The first scan signal SCAN1 provided by the first scan line GL1 is a low-level signal, the reset control signal RESET provided by the reset control line RST and a light emitting control signal EM provided by the light emitting control line EML are both high-level signals, and the data line DL outputs the data signal DATA. At this stage, the drive transistor M3 is turned on. The data voltage Vdata output by the data line DL is provided to the sixth node P1 through the seventh node P2, the turned-on drive transistor M3, the eighth node P3, and the turned-on threshold compensation transistor M2, and the second storage capacitor C2 is charged with a difference between the data voltage Vdata output by the data line DL and a threshold voltage of the drive transistor M3. The second reset transistor M7 is turned on, so that the initial signal Vinit provided by the initial signal line INIT is provided to the ninth node P4, and the anodes of the first-region light emitting elements EL1 and EL2 are initialized (reset), so as to ensure that the first-region light emitting elements EL1 and EL2 do not emit light.

The third stage Q3 is referred to as an emitting stage. The light emitting control signal EM provided by the light emitting control line EML is a low-level signal, and the first scan signal SCAN1 provided by the first scan line GL1 and the first reset control signal RESET provided by the reset control line RST are high-level signals. The first light emitting control transistor M5 and the second light emitting control transistor M6 are turned on, and a first voltage signal VDD output by the first power line PL1 provides a drive voltage to the ninth electrode P4 through the turned-on first light emitting control transistor M5, the drive transistor M3, and the second light emitting control transistor M6 to drive the first-region light emitting element EL1 and EL2 to emit light.

In a drive process of the first-region pixel circuit, a drive current flowing through the drive transistor M3 is determined by a voltage difference between the control electrode and the first electrode of the drive transistor M3. Since the voltage of the sixth node P1 is Vdata−|Vth|, the drive current of the drive transistor M3 is as follows.

$$I = K \times (Vgs - Vth)^2 =$$
$$K \times [(VDD - Vdata + |Vth|) - Vth]^2 = K \times [VDD - Vdata]^2;$$

I is a drive current flowing through the drive transistor M3, that is, the drive current for driving the first-region light emitting elements EL1 and EL2; K is a constant; Vgs is the voltage difference between the control electrode and the first electrode of the drive transistor M3; Vth is the threshold voltage of the drive transistor M3; Vdata is the data voltage output by the data line DL; and VDD is the first voltage signal output by the first power line PL1.

It may be seen from the above formula that a current flowing through the first-region light emitting elements EL1 and EL2 is independent of the threshold voltage of the drive transistor M3. Therefore, the first-region pixel circuit in this embodiment may better compensate the threshold voltage of the drive transistor M3.

Figure 12:
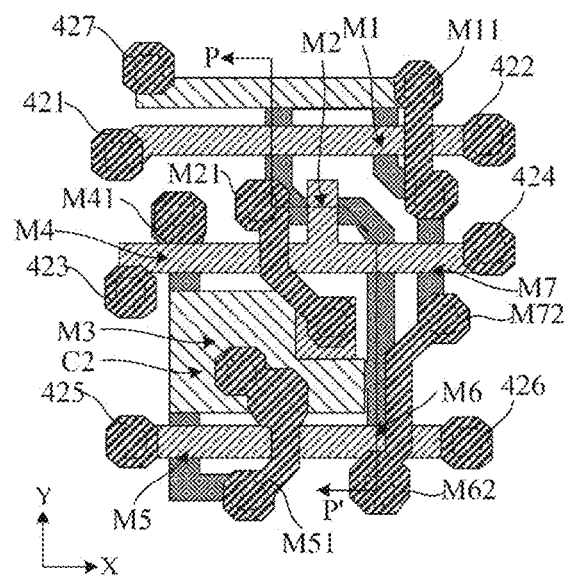
FIG. 12 is a top view of a first-region pixel circuit according to at least one embodiment of the present disclosure.
Figure 13:
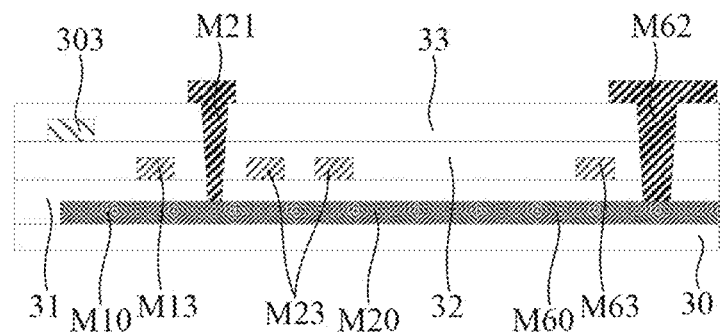
FIG. 13 is a cross-sectional view of a part taken along a direction P-P' in FIG. 12.
Figure 14A:
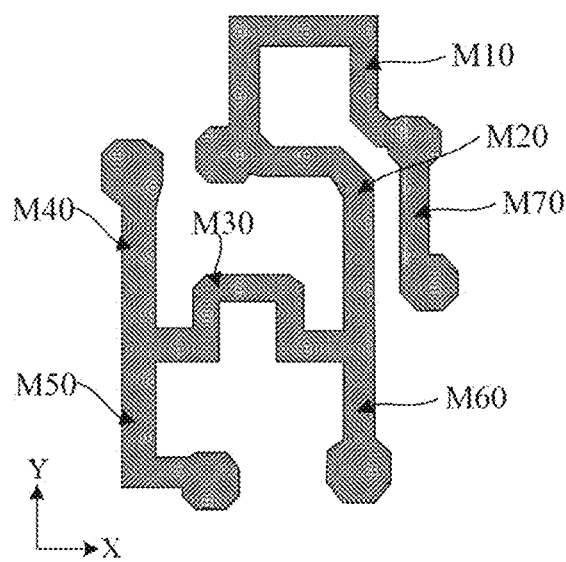
FIG. 14A is a top view of a first-region pixel circuit after a forming first semiconductor layer according to at least one embodiment of the present disclosure.
Figure 14B:
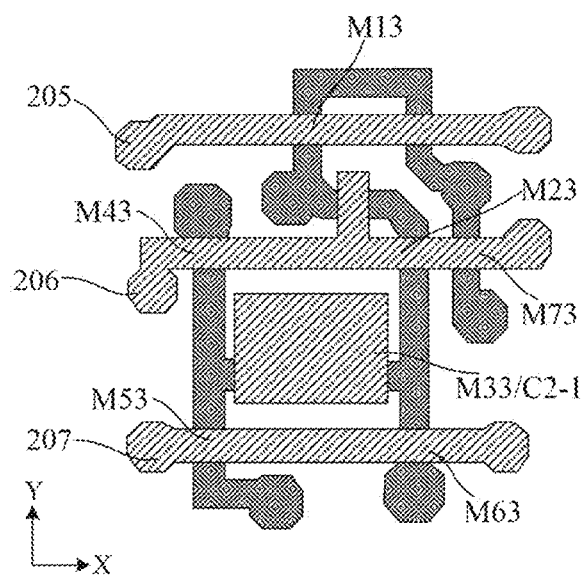
FIG. 14B is a top view of a first-region pixel circuit after forming a first conductive layer according to at least one embodiment of the present disclosure.
Figure 14C:
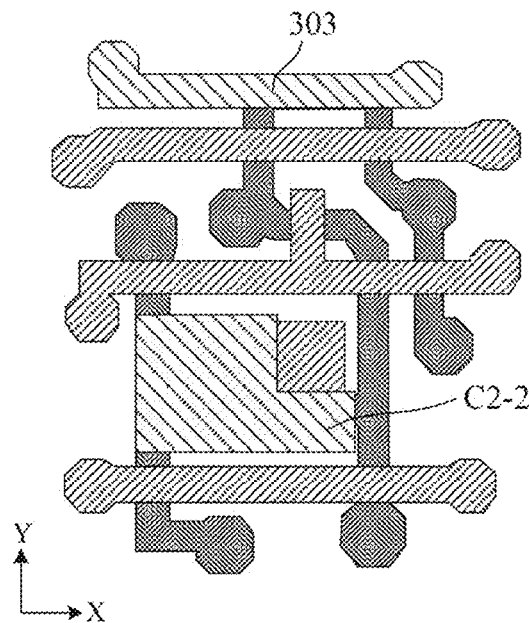
FIG. 14C is a top view of a first-region pixel circuit after forming a second conductive layer according to at least one embodiment of the present disclosure.
Figure 14D:
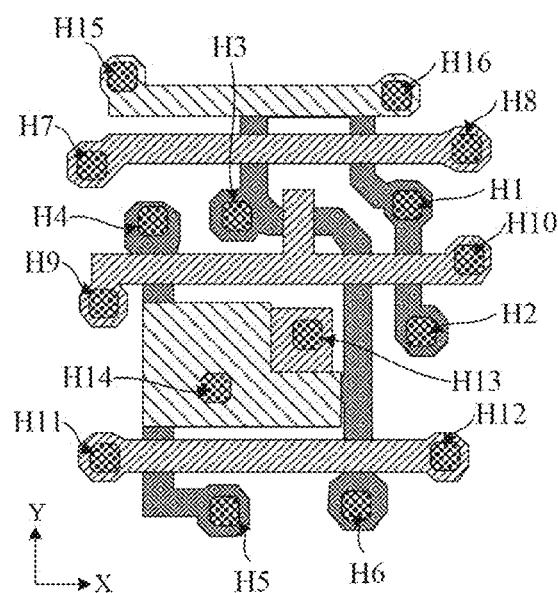
FIG. 14D is a top view of a first-region pixel circuit after forming a third insulating layer according to at least one embodiment of the present disclosure.

FIG. 12 is a top view of a first-region pixel circuit according to at least one embodiment of the present disclosure. FIG. 13 is a cross-sectional view of a part taken along a direction P-P' in FIG. 12. FIG. 14A is a top view of a first-region pixel circuit after a forming first semiconductor layer according to at least one embodiment of the present disclosure. FIG. 14B is a top view of a first-region pixel circuit after forming a first conductive layer according to at least one embodiment of the present disclosure. FIG. 14C is a top view of a first-region pixel circuit after forming a second conductive layer according to at least one embodiment of the present disclosure. FIG. 14D is a top view of a first-region pixel circuit after forming a third insulating layer according to at least one embodiment of the present disclosure.

In some exemplary implementations, in a direction perpendicular to the display substrate, as shown in FIG. 13, the pixel circuit layer in the first display region may include a first semiconductor layer, a first conductive layer (also known as a first gate metal layer), a second conductive layer (also known as a second gate metal layer), and a third conductive layer (also known as a first source-drain metal layer) that are sequentially disposed on the base substrate 30. A first insulating layer 31 (also known as a first gate metal layer) is provided between the semiconductor layer and the first conductive layer, a second insulating layer 32 (also known as a second gate metal layer) is provided between the first conductive layer and the second conductive layer, and a third insulating layer 33 (also known as an interlayer insulating layer) is provided between the second conductive layer and the third conductive layer. In some examples, the first to third insulating layers 31 to 33 may be inorganic insulating layers. A passivation layer, a first transparent conductive layer, a first flat layer, a first electrical connection layer, a second flat layer, a second transparent conductive layer, a third flat layer, an anode layer, a pixel defining layer, an organic light emitting layer, and a cathode layer may be sequentially provided on a side of the pixel circuit layer away from the base substrate 30. The film layer structure on the side of the pixel circuit layer away from the base substrate 30 can be described with reference to the foregoing embodiments and is therefore not described here.

In some exemplary implementations as shown in FIGS. 12 and 14A, the first semiconductor layer of the first-region pixel circuit may include active layers of a plurality of transistors, e.g., an active layer M10 of the first reset transistor M1, an active layer M20 of the threshold compensation transistor M2, an active layer M30 of the drive transistor M3, an active layer M40 of the data writing transistor M4, an active layer M50 of the first light emitting control transistor M5, an active layer M60 of the second light emitting control transistor M6, and an active layer M70 of the second reset transistor T7. The active layers of the seven transistors of the first-region pixel circuit may be of an integral structure in which the active layers are connected with each other. In some examples, a material of the semiconductor layer may include poly-silicon. However, this embodiment is not limited thereto.

In some exemplary implementations as shown in FIG. 14B, the first conductive layer of the first-region pixel circuit may include control electrodes of a plurality of transistors (e.g., a control electrode M13 of the first reset transistor M1, a control electrode M23 of the threshold compensation transistor M2, a control electrode M33 of the drive transistor M3, a control electrode M43 of the data writing transistor M4, a control electrode M53 of the first light emitting control transistor M5, a control electrode M63 of the second light emitting control transistor M6, and a control electrode M73 of the second reset transistor M7), a first electrode C2-1 of the second storage capacitor C2, a first connection line 205, a second connection line 206 and a third connection line 207. All of the first connection line 205, the second scan connection line 206 and the third connection line 207 extend in the first direction X and are sequentially arranged in the second direction Y.

In some exemplary implementations as shown in FIG. 14B, the control electrode M13 of the first reset transistor M1 and the first connection line 205 are of an integral structure. The control electrode M23 of the threshold compensation transistor M2, the control electrode M43 of the data writing transistor M4, the control electrode M73 of the second reset transistor M7, and the second connection line 206 are of an integral structure. The control electrode M53 of the first light emitting control transistor M5, the control electrode M63 of the second light emitting control transistor M6 and the third connection line 207 may be of an integral structure. The control electrode M33 of the drive transistor M3 and the first electrode C2-1 of the second storage capacitor C2 may be of an integral structure.

In some exemplary implementations as shown in FIG. 14C, the second conductive layer of the first-region pixel circuit may include a fourth connection line 303, a second electrode C2-2 of a second storage capacitor C2. The fourth connection electrode 303 extends in the first direction X. An orthographic projection of the fourth connection line 303 on the base substrate is located on a side of an orthographic projection of the first connection line 205 on the base substrate away from an orthographic projection of the second connection line 206 on the base substrate.

In some exemplary implementations as shown in FIG. 14D, a plurality of via holes are opened on the third insulating layer of the first-region pixel circuit, and the plurality of via holes may include first to sixteenth via holes H1 to H16. The third insulating layers 33, the second insulating layers 32 and the first insulating layers 31 within the first to the sixth via holes H1 to H6 are etched off to expose a surface of the first semiconductor layer. The third insulating layers 33 and the second insulating layers 32 within the seventh to the thirteenth via holes H7 to H13 are etched off to expose a surface of the first conductive layer. The third insulating layers 33 within the fourteenth to the sixteenth via holes H14 to H16 are etched off to expose a surface of the second conductive layer.

In some exemplary implementations as shown in FIG. 12, the third conductive layer of the first-region pixel circuit may include first and second electrodes of a plurality of transistors (e.g., a first electrode M11 of the first reset transistor M1, a second electrode M72 of the second reset transistor M7, a first electrode M21 of the threshold compensation transistor M2, a first electrode M41 of the data writing transistor M4, a first electrode M51 of the first light emitting control transistor M5 and a second electrode M62 of the second light emitting control transistor M6), and a plurality of connection electrodes (e.g., a twenty-first connection electrode 421, a twenty-second connection electrode 422, a twenty-third connection electrode 423, a twenty-fourth connection electrode 424, a twenty-fifth connection electrode 425, a twenty-sixth connection electrode 426 and a twenty-seventh connection electrode 427).

In some exemplary implementations as shown in FIGS. 12 and 14D, the first electrode M11 of the first reset transistor M1 is electrically connected with one end of the fourth connection line 303 through the sixteenth via hole H16, and is also electrically connected with a first doped region of the active layer M10 of the first reset transistor M1 through the first via hole H1. Another end of the fourth connection line 303 is electrically connected with the twenty-seventh connection electrode 427 through the fifteenth via hole H15. The second electrode M72 of the second reset transistor M7 is electrically connected with a second doped region of the active layer M70 of the second reset transistor M7 through the second via hole H2. The second electrode M62 of the second light emitting control transistor M6 is electrically connected with a second doped region of the active layer M60 of the second light emitting control transistor M6 through the sixth via hole H6. The second electrode M72 of the second reset transistor M7 and the second electrode M62 of the second light emitting control transistor M6 may be of an integral structure. The first electrode M51 of the first light emitting control transistor M5 is electrically connected with a first doped region of the active layer M50 of the first light emitting control transistor M5 through the fifth via hole H5, and is also electrically connected with the second electrode C2-2 of the second storage capacitor C2 through the fourteenth via hole H14. The first electrode M41 of the data writing transistor M4 is electrically connected with a first doped region of the active layer M40 of the data writing transistor M4 through the fourth via hole H4. The first electrode M21 of the threshold compensation transistor M2 is electrically connected with a first doped region of the active layer M20 of the threshold compensation transistor M2 through the third via hole H3, and is also electrically connected with the first electrode C2-1 of the second storage capacitor C2 through the thirteenth via hole H13.

In some exemplary implementations as shown in FIGS. 12 and 14D, the twenty-first connection electrode 421 is electrically connected with one end of the first connection line 205 through the seventh via hole H7, and the twenty-second connection electrode 422 is electrically connected with another end of the first connection line 205 through the eighth via hole H8. The twenty-third connection electrode 423 is electrically connected within one end of the second connection line 206 through the ninth via hole H9, and the twenty-fourth connection electrode 424 is electrically connected with another end of the second connection line 206 through the tenth via hole H10. The twenty-fifth connection electrode 425 is electrically connected with one end of the third connection line 207 through the eleventh via hole H11, and the twenty-sixth connection electrode 426 is electrically connected with another end of the third connection line 207 through the twelfth via hole H12.

In some exemplary implementations, the first scan line at the first transparent conductive layer may be electrically connected with the second connection line 206 through the twenty-third connection electrode 423, the twenty-fourth connection electrode 424, a reset control line at the first transparent conductive layer may be electrically connected with the first connection line 205 through the twenty-first connection electrode 421, the twenty-second connection electrode 422, a light emitting control line at the first transparent conductive layer may be electrically connected with the third connection line 207 through the twenty-fifth connection electrode 425 and the twenty-sixth connection electrode 426, and an initial signal line at the first transparent conductive layer may be electrically connected with the fourth connection line 303 through the twenty-seventh connection electrode 427 and the first electrode M11 of the first reset control transistor. However, this embodiment is not limited thereto.

A method for manufacturing a display substrate is further provided in at least one embodiment of the present disclosure, which includes the following acts: a plurality of first-region pixel circuits and a plurality of first-region light emitting elements are sequentially formed on the base substrate of the transparent display region in the display region. At least one first-region pixel circuit of the plurality of first-region pixel circuits is electrically connected with two first-region light emitting elements emitting light in a same color. An orthographic projection of at least one first-region pixel circuit on the base substrate is overlapped with an orthographic projection of a first-region light emitting element on the base substrate.

In some exemplary implementations, forming the plurality of first-region pixel circuits and the plurality of first-region light emitting elements on the base substrate of the transparent display region in the display region may include sequentially forming a pixel circuit layer, a first transparent conductive layer and a second transparent conductive layer on the base substrate of the transparent display region. The pixel circuit layer includes a plurality of first-region pixel circuits. The first transparent conductive layer at least includes a plurality of first signal lines extending along a first direction. The second transparent conductive layer at least includes an anode connection line and a plurality of second signal lines extending along a second direction. The anode connection line is electrically connected with one first-region pixel circuit and anodes of two first-region light emitting elements emitting light in a same color. The first-region pixel circuit is electrically connected with at least one first signal line and at least one second signal line. The first direction and the second direction intersect.

For the method for manufacturing the display substrate in this embodiment, reference may be made to descriptions of the aforementioned embodiments, and thus will not be repeated here.

A display device is further provided in at least an embodiment of the present disclosure, which includes the display substrate as described above.

Figure 15:
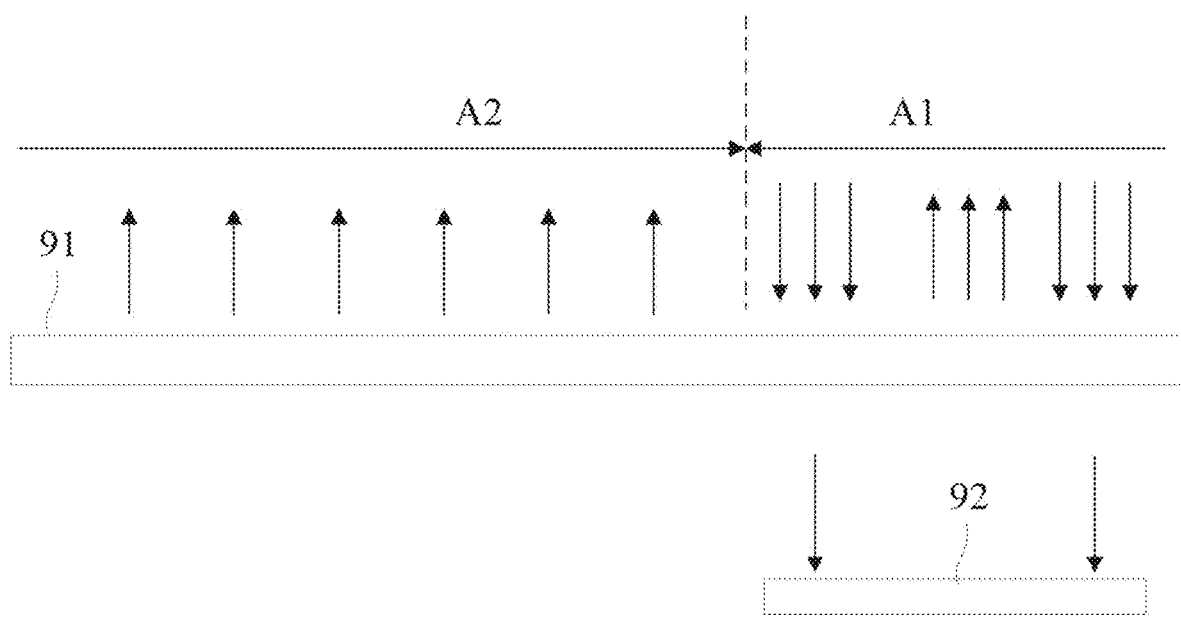
FIG. 15 is a schematic diagram of a display device according to at least one embodiment of the present disclosure.

FIG. 15 is a schematic diagram of a display device according to at least one embodiment of the present disclosure. As shown in FIG. 15, a display device is provide in this embodiment, which includes a display substrate 91 and a photosensitive sensor 92 located on a light exit side of a display structure layer away from the display substrate 91. An orthographic projection of the photosensitive sensor 92 on the display substrate 91 is overlapped with the first display region A1.

In some exemplary implementations, the display substrate 91 may be a flexible OLED display substrate, a QLED display substrate, a Micro-LED display substrate or a Mini-LED display substrate. The display device may be any product or component with a display function such as an OLED display, a cell phone, a tablet, a television, a display, a laptop, a digital photo frame, a navigator, and so on, which is not limited in the embodiments of the present disclosure.

The drawings of the present disclosure only involve structures involved in the present disclosure, and other structures may refer to conventional designs. The embodiments in the present disclosure, i.e., features in the embodiments, may be combined with each other to obtain new embodiments if there is no conflict.

Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising:
   a base substrate, comprising a display region and a peripheral region at least partially surrounding the display region, wherein the display region comprises a transparent display region;
   a plurality of first-region light emitting elements and a plurality of first-region pixel circuits located in the transparent display region; wherein at least one first-region pixel circuit of the plurality of first-region pixel circuits is electrically connected with at least two first-region light emitting elements emitting light in a same color; and
   an orthographic projection of the at least one first-region pixel circuit on the base substrate is overlapped with an orthographic projection of at least one first-region light emitting element on the base substrate;
   wherein the plurality of first-region light emitting elements at least comprises a plurality of first light emitting elements emitting light in a first color, a plurality of second light emitting elements emitting light in a second color, and a plurality of third light emitting elements emitting light in a third color;
   an anode area of at least one first light emitting element of the plurality of first light emitting elements is larger than an anode area of at least one third light emitting element of the plurality of third light emitting elements, and an anode area of at least one second light emitting element of the plurality of second light emitting elements is larger than an anode area of the at least one third light emitting element; and
   an orthographic projection of the at least one first-region pixel circuit on the base substrate is overlapped with an orthographic projection of the at least one first light emitting element or the at least one second light emitting element on the base substrate.

2. The display substrate of claim 1, wherein the first color is red light, the second color is blue, and the third color is green.

3. The display substrate of claim 1, wherein the plurality of first-region light emitting elements are arranged according to a Pentile structure.

4. The display substrate of claim 1, wherein the plurality of first-region pixel circuits comprise at least one first pixel circuit, at least one second pixel circuit, and at least one third pixel circuit; wherein the at least one first pixel circuit is electrically connected with two first light emitting elements, the at least one second pixel circuit is electrically connected with two second light emitting elements, and the at least one third pixel circuit is electrically connected with two third light emitting elements;
   an orthographic projection of the at least one first pixel circuit on the base substrate is overlapped with an orthographic projection of one electrically connected first light emitting element on the substrate;
   an orthographic projection of the at least one second pixel circuit on the base substrate is overlapped with an orthographic projection of one electrically connected second light emitting element on the base substrate; and
   an orthographic projection of the at least one third pixel circuit on the base substrate is overlapped with an orthographic projection of a first light emitting element or a second light emitting element adjacent to two electrically connected third light emitting elements on the base substrate.

5. The display substrate of claim 1, wherein in a plane perpendicular to the transparent display region, the display substrate at least comprises a pixel circuit layer, a first transparent conductive layer and a second transparent conductive layer that are disposed on the base substrate;
   wherein the pixel circuit layer comprises the plurality of first-region pixel circuits;
   the first transparent conductive layer at least comprises a plurality of first signal lines extending along a first direction;
   the second transparent conductive layer at least comprises a plurality of anode connection lines and a plurality of second signal lines extending along a second direction;
   at least one anode connection line of the plurality of anode connection lines is electrically connected with the at least one first-region pixel circuit and anodes of at least two first-region light emitting elements emitting light in a same color;
   the at least one first-region pixel circuit is electrically connected with at least one first signal line and at least one second signal line; wherein the first direction intersects with the second direction.

6. The display substrate of claim 5, wherein the transparent display region further comprises a first electrical connection layer between the first transparent conductive layer and the second transparent conductive layer;
   the first transparent conductive layer further comprises a first anode connection electrode electrically connected with the first-region pixel circuit;
   the first electrical connection layer at least comprises a second anode connection electrode electrically connected with the first anode connection electrode;
   wherein an anode connection line of the second transparent conductive layer is electrically connected with the second anode connection electrode.

7. The display substrate of claim 6, wherein the first transparent conductive layer further comprises a plurality of first power lines extending along the second direction, and at least one of the plurality of first power lines comprises a plurality of sub-power lines;
the first electrical connection layer further comprises a plurality of power supply connection lines extending along the second direction; and
in the second direction, adjacent sub-power lines of the first power line are electrically connected through a power supply connection line of the plurality of power supply connection lines.

8. The display substrate of claim 5, wherein the at least one first signal line comprises a plurality of sub-signal lines; in the first direction, adjacent sub-signal lines of the first signal line are electrically connected through the first-region pixel circuit.

9. The display substrate of claim 5, wherein the plurality of first signal lines comprise at least one of the followings: a first scan line, a second scan line, a reset control line, an initial signal line, and a light emitting control line.

10. The display substrate of claim 9, wherein an orthographic projection of the first scan line on the base substrate is located between an orthographic projection of the reset control line on the base substrate and an orthographic projection of the second scan line on the base substrate.

11. The display substrate of claim 10, wherein the orthographic projection of the reset control line on the base substrate is located between an orthographic projection of the initial signal line on the base substrate and the orthographic projection of the first scan line on the base substrate, and the orthographic projection of the second scan line on the base substrate is located between the orthographic projection of the first scan line on the base substrate and an orthographic projection of the light emitting control line on the base substrate.

12. The display substrate of claim 11, wherein the first-region pixel circuit comprises at least one first type transistor, at least one second type transistor and at least one storage capacitor;
in a plane perpendicular to the display substrate, the pixel circuit layer of the transparent display region comprises a first semiconductor layer, a first conductive layer, a second conductive layer, a second semiconductor layer, a third conductive layer, and a fourth conductive layer which are disposed on the base substrate;
the first semiconductor layer at least comprises an active layer of the at least one first type transistor of the first-region pixel circuit;
the first conductive layer at least comprises a control electrode of the at least one first type transistor and a first electrode of the at least one storage capacitor of the first-region pixel circuit;
the second conductive layer at least comprises a second electrode of the at least one storage capacitor of the first-region pixel circuit;
the second semiconductor layer at least comprises an active layer of the at least one second type transistor of the first-region pixel circuit;
the third conductive layer at least comprises a control electrode of the at least one second type transistor of the first-region pixel circuit; and
the fourth conductive layer at least comprises a plurality of connection electrodes.

13. The display substrate of claim 12, wherein the at least one first type transistor of the first-region pixel circuit at least comprises a drive transistor; and
an orthographic projection of the active layer of the at least one second type transistor of the first-region pixel circuit on the base substrate is overlapped with an orthographic projection of the drive transistor on the base substrate.

14. The display substrate of claim 13, wherein an orthographic projection of the control electrode of the at least one second type transistor of the first-region pixel circuit on the base substrate is located between the orthographic projection of the at least one storage capacitor of the first-region pixel circuit on the base substrate and the orthographic projection of the first scan line, which is electrically connected with the first-region pixel circuit, on the base substrate.

15. The display substrate of claim 5, wherein the plurality of second signal lines comprise a plurality of data lines;
there is no data lines arranged between first-region pixel circuits in a k-th column and first-region pixel circuits in a (k+1)-th column, and there are a plurality of data lines arranged between the first-region pixel circuits in the (k+1)-th column and first-region pixel circuits in a (k+2)-th column, wherein k is an integer.

16. The display substrate of claim 1, wherein the first-region pixel circuit comprises a plurality of transistors and at least one storage capacitor;
in a plane perpendicular to the display substrate, the pixel circuit layer of the transparent display region comprises a first semiconductor layer, a first conductive layer, a second conductive layer, and a third conductive layer which are disposed on the base substrate;
the first semiconductor layer at least comprises active layers of a plurality of transistors of the first-region pixel circuit;
the first conductive layer at least comprises control electrodes of a plurality of transistors and a first electrode of the at least one storage capacitor of the first-region pixel circuit;
the second conductive layer at least comprises a second electrode of the at least one storage capacitor of the first-region pixel circuit;
the third conductive layer at least comprises a plurality of connection electrodes.

17. The display substrate of claim 1, wherein the display region further comprises a non-transparent display region located on at least one side of the transparent display region; wherein
the non-transparent display region is provided with a plurality of second-region light emitting elements and a plurality of second-region pixel circuits;
at least one second-region light emitting element of the plurality of second-region light emitting elements is electrically connected with at least one second-region pixel circuit of the plurality of second-region pixel circuits, and an orthographic projection of the at least one second-region light emitting element on the base substrate is overlapped with an orthographic projection of the electrically connected second-region pixel circuit on the base substrate.

18. The display substrate of claim 17, an area of a light emitting region of the at least one first-region light emitting element is 40% to 60% of an area of a light emitting region of the at least one second-region light emitting element that emits light in a same color.

19. A display device, comprising the display substrate of claim 1.

\* \* \* \* \*